(12) United States Patent
Haga

(10) Patent No.: US 10,763,898 B2
(45) Date of Patent: Sep. 1, 2020

(54) MEMORY SYSTEM THAT CARRIES OUT SOFT BIT DECODING

(71) Applicant: TOSHIBA MEMORY CORPORATION, Tokyo (JP)

(72) Inventor: Takuya Haga, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/352,540

(22) Filed: Mar. 13, 2019

(65) Prior Publication Data

US 2019/0215019 A1    Jul. 11, 2019

Related U.S. Application Data

(62) Division of application No. 15/446,938, filed on Mar. 1, 2017, now abandoned.

(30) Foreign Application Priority Data

Sep. 13, 2016   (JP) .................................. 2016-178783

(51) Int. Cl.
*H03M 13/45*   (2006.01)
*G11C 16/34*   (2006.01)
(Continued)

(52) U.S. Cl.
CPC ....... *H03M 13/458* (2013.01); *G06F 11/1012* (2013.01); *G06F 11/1068* (2013.01);
(Continued)

(58) Field of Classification Search
CPC ... H03M 13/458; H03M 13/45; G11C 16/349; G11C 29/52
See application file for complete search history.

(56) References Cited

U.S. PATENT DOCUMENTS 7,852,675 B2   12/2010   Maejima
8,233,323 B2    7/2012   Hishida et al.
(Continued)

FOREIGN PATENT DOCUMENTS

JP    2011081858 A    4/2011
JP    2012244305 A   12/2012
(Continued)

*Primary Examiner* — Joseph D Torres
(74) *Attorney, Agent, or Firm* — Kim & Stewart LLP

(57) ABSTRACT

A memory system includes a nonvolatile semiconductor memory and a controller. The controller is configured to maintain a plurality of log likelihood ratio (LLR) tables for predicting a value of data read from the nonvolatile semiconductor memory, count a number of times that each of write operations, erase operations, and read operations have been carried out with respect to each unit storage region of the nonvolatile semiconductor memory, determine an order in which the LLR tables are referred to, based on the counted number of the read operations and one of the counted number of the write operations and the counted number of the erase operations, which correspond to a target unit storage region of a read operation, and carry out decoding of data read from the target unit storage region of the read operation, using one of the LLR tables selected according to the determined order.

12 Claims, 20 Drawing Sheets

(51) Int. Cl.

| | | |
|---|---|---|
| *G11C 29/52* | (2006.01) | |
| *G11C 11/56* | (2006.01) | |
| *G06F 11/10* | (2006.01) | |
| *H03M 13/11* | (2006.01) | |
| *H03M 13/00* | (2006.01) | |
| *G11C 16/14* | (2006.01) | |
| *G11C 16/26* | (2006.01) | |
| *G11C 16/16* | (2006.01) | |
| *G11C 29/04* | (2006.01) | |

(52) U.S. Cl.
CPC .......... *G11C 11/5642* (2013.01); *G11C 16/14* (2013.01); *G11C 16/26* (2013.01); *G11C 16/349* (2013.01); *G11C 29/52* (2013.01); *H03M 13/1111* (2013.01); *H03M 13/45* (2013.01); *H03M 13/6325* (2013.01); *G11C 16/16* (2013.01); *G11C 2029/0411* (2013.01)

(56) References Cited

U.S. PATENT DOCUMENTS

| | | |
|---|---|---|
| 8,250,437 B2 | 8/2012 | Sakurada et al. |
| 8,372,720 B2 | 2/2013 | Fukuzumi et al. |
| 8,514,627 B2 | 8/2013 | Itagaki et al. |
| 8,782,496 B2 | 7/2014 | Sakaue et al. |
| 8,952,426 B2 | 2/2015 | Maejima |
| 8,984,376 B1* | 3/2015 | Norrie ................ H03M 13/1142 714/772 |
| 9,036,411 B2 | 5/2015 | Itagaki |
| 9,337,865 B2 | 5/2016 | Cohen et al. |
| 9,633,740 B1* | 4/2017 | Alhussien ............. G11C 16/28 |
| 9,916,906 B2* | 3/2018 | Wu ........................ G11C 29/52 |
| 2011/0284946 A1 | 11/2011 | Kiyotoshi |
| 2012/0072805 A1* | 3/2012 | Tseng ................. G06F 11/1048 714/773 |
| 2014/0040704 A1* | 2/2014 | Wu ..................... G06F 11/1068 714/773 |
| 2014/0233322 A1* | 8/2014 | Wu .................... G11C 16/3404 365/185.24 |
| 2015/0149871 A1* | 5/2015 | Chen ................... G11C 29/021 714/773 |
| 2015/0188577 A1* | 7/2015 | Ogawa ............. H03M 13/6337 714/759 |
| 2015/0256201 A1* | 9/2015 | Sakurada ............ G11C 29/021 714/719 |
| 2016/0266969 A1* | 9/2016 | Jeon ..................... G06F 11/1012 |
| 2017/0269994 A1* | 9/2017 | Maffeis ................ G11C 11/5642 |

FOREIGN PATENT DOCUMENTS

| | | |
|---|---|---|
| JP | 2015015701 A | 1/2015 |
| JP | 2015133161 A | 7/2015 |

* cited by examiner

FIG. 4
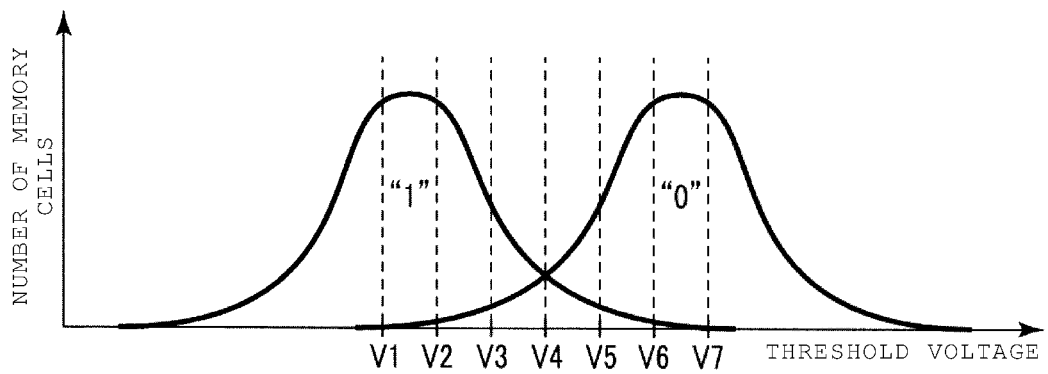
FIG. 5
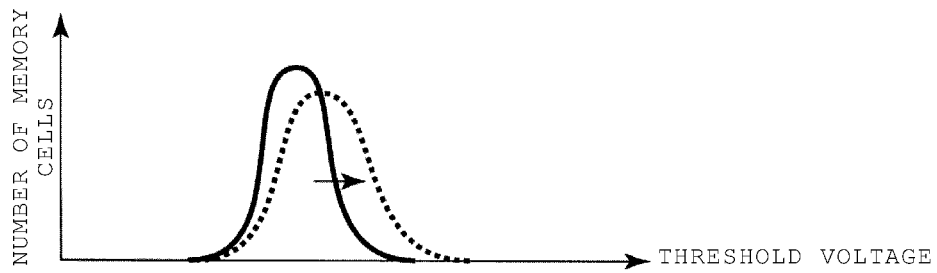
FIG. 6
| CONDITION | ORDER OF SELECTING LLR TABLE |
|---|---|
| CONDITION A | TW1→TW2→TW3 |
| CONDITION B | TW1→TW3→TW2 |
| CONDITION C | TW2→TW1→TW3 |
| CONDITION D | TW2→TW3→TW1 |
| CONDITION E | TW3→TW1→TW2 |
| CONDITION F | TW3→TW2→TW1 |

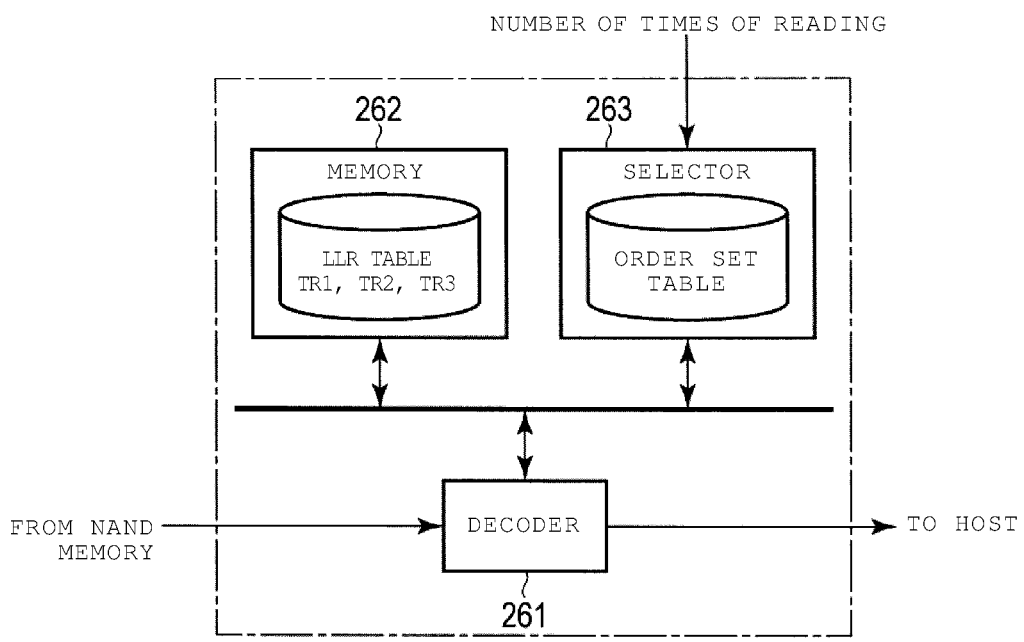

| CONDITION | | ORDER OF SELECTING LLR TABLE |
|---|---|---|
| NUMBER OF TIMES W/E | NUMBER OF TIMES OF READING | |
| SMALL | SMALL | TW1→TR1→TW2→TR2 |
| SMALL | LARGE | TR2→TR1→TW1→TW2 |
| LARGE | SMALL | TW2→TW1→TR1→TR2 |
| LARGE | LARGE | TW2→TR2→TW1→TR1 |

| CONDITION | | ORDER OF SELECTING LLR TABLE |
|---|---|---|
| NUMBER OF TIMES W/E | NUMBER OF TIMES OF READING | |
| SMALL | SMALL | TWR1→TWR2→TWR3→TWR4 |
| SMALL | LARGE | TWR2→TWR1→TWR4→TWR3 |
| LARGE | SMALL | TWR3→TWR4→TWR1→TWR2 |
| LARGE | LARGE | TWR4→TWR3→TWR2→TWR1 |

| ADDRESS | ORDER OF SELECTING LLR TABLE |
|---|---|
| FIRST REGION | T1→T2→T3 |
| SECOND REGION | T2→T1→T3 |
| THIRD REGION | T3→T2→T1 |

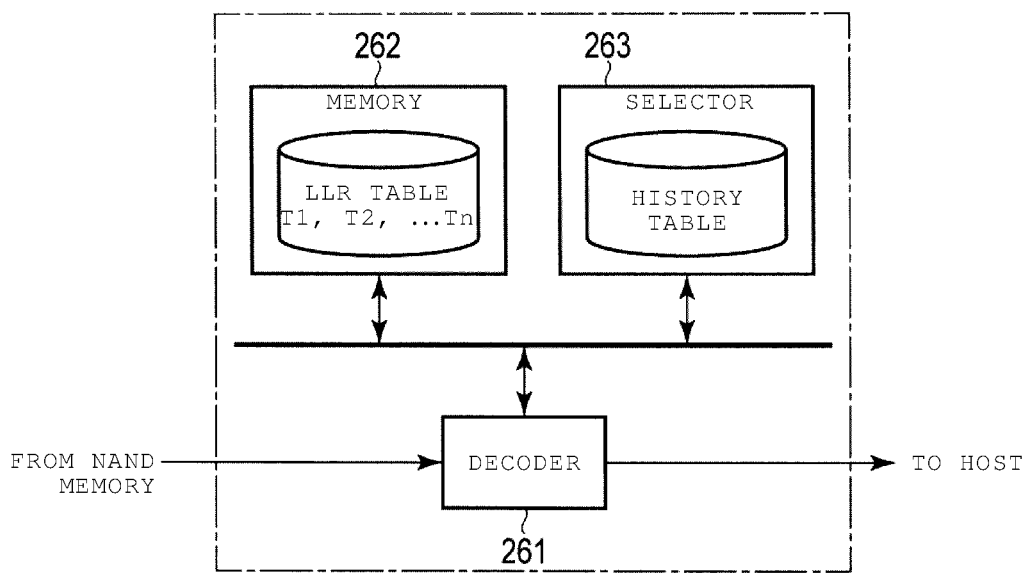

FIG. 25

HISTORY TABLE GROUP

BLK0

| LLR TABLE | NUMBER OF TIMES OF SUCCESSFUL CORRECTION |
|---|---|
| T1 | N1-0 |
| T2 | N2-0 |
| T3 | N3-0 |
| T4 | N4-0 |
| ... | ... |
| Tn | Nn-0 |

BLK1

| LLR TABLE | NUMBER OF TIMES OF SUCCESSFUL CORRECTION |
|---|---|
| T1 | N1-1 |
| T2 | N2-1 |
| T3 | N3-1 |
| T4 | N4-1 |
| ... | ... |
| Tn | Nn-1 |

BLKm

| LLR TABLE | NUMBER OF TIMES OF SUCCESSFUL CORRECTION |
|---|---|
| T1 | N1-m |
| T2 | N2-m |
| T3 | N3-m |
| T4 | N4-m |
| ... | ... |
| Tn | Nn-m |

FIG. 27

HISTORY TABLE GROUP

NUMBER OF TIMES W/E = FIRST RANGE

| LLR TABLE | NUMBER OF TIMES OF SUCCESSFUL CORRECTION |
|---|---|
| T1 | N1-0 |
| T2 | N2-0 |
| T3 | N3-0 |
| T4 | N4-0 |
| ... | ... |
| Tn | Nn-0 |

NUMBER OF TIMES W/E = SECOND RANGE

| LLR TABLE | NUMBER OF TIMES OF SUCCESSFUL CORRECTION |
|---|---|
| T1 | N1-1 |
| T2 | N2-1 |
| T3 | N3-1 |
| T4 | N4-1 |
| ... | ... |
| Tn | Nn-1 |

......

NUMBER OF TIMES W/E = k-th RANGE

| LLR TABLE | NUMBER OF TIMES OF SUCCESSFUL CORRECTION |
|---|---|
| T1 | N1-k |
| T2 | N2-k |
| T3 | N3-k |
| T4 | N4-k |
| ... | ... |
| Tn | Nn-k |

MEMORY SYSTEM THAT CARRIES OUT SOFT BIT DECODING

CROSS-REFERENCE TO RELATED APPLICATION

This application is a divisional of U.S. patent application Ser. No. 15/446,938, filed Mar. 1, 2017, which application is based upon and claims the benefit of priority from Japanese Patent Application No. 2016-178783, filed Sep. 13, 2016, the entire contents of which are incorporated herein by reference.

FIELD

Embodiments described herein relate generally to a memory system.

BACKGROUND

Soft-decision decoding is known as a method of correcting an error included in data read from a semiconductor memory.

DESCRIPTION OF THE DRAWINGS

FIG. 4 is a graph illustrating overlapped threshold distributions of the memory cells.

FIG. 5 is a graph illustrating a shift of a threshold distribution of the memory cells.

FIG. 6 illustrates a structure of an order set table according to the first embodiment.

FIG. 9 is a block diagram of an ECC circuit according to a second embodiment.

FIG. 10 illustrates a structure of an order set table according to the second embodiment.

FIG. 22 is a block diagram of an ECC circuit according to a fifth embodiment.

FIG. 23 illustrates a structure of a history table according to the fifth embodiment.

FIG. 25 illustrates a structure of a history table according to a sixth embodiment.

FIG. 27 illustrates a structure of a history table according to a seventh embodiment.

DETAILED DESCRIPTION

Figure 1:
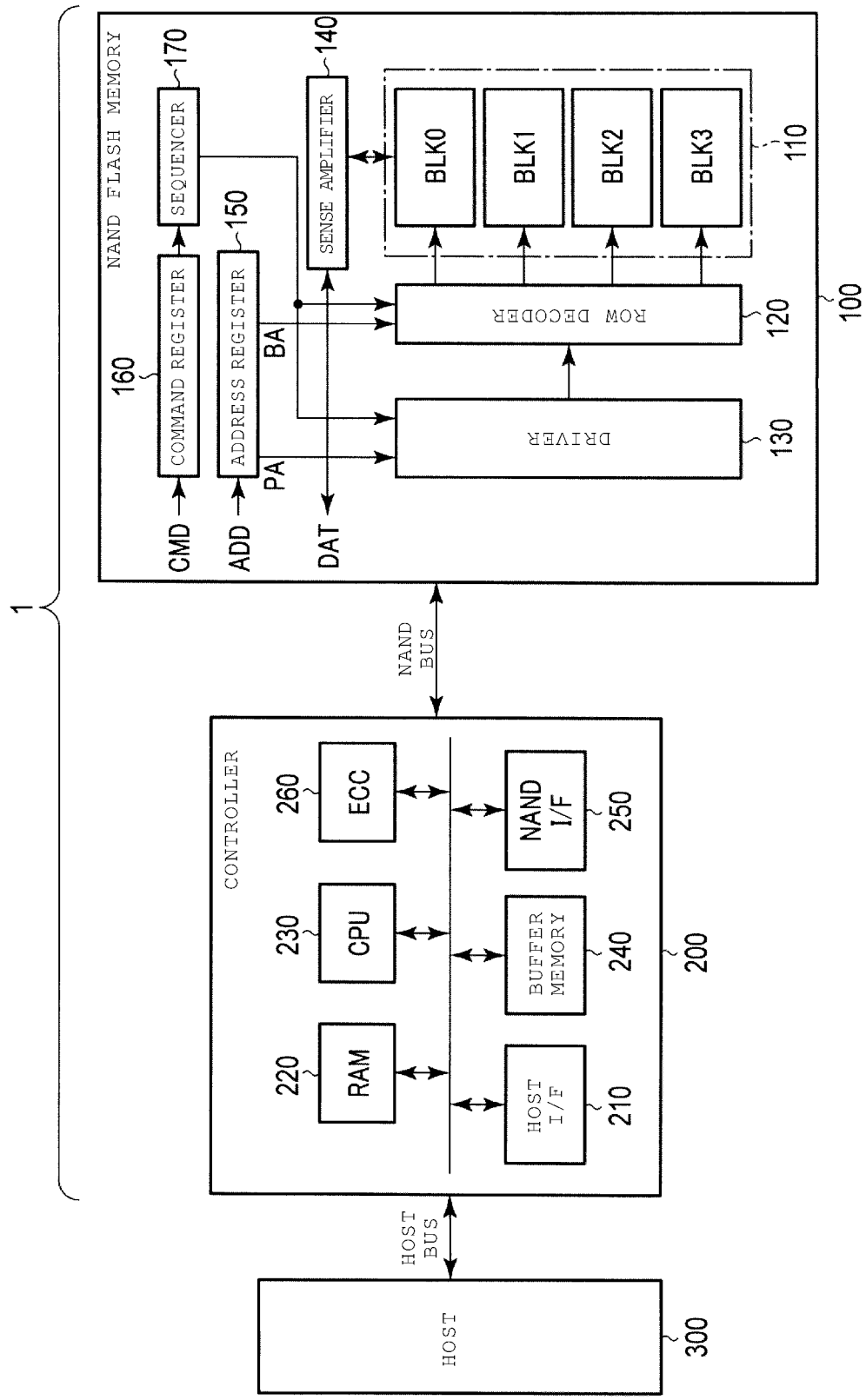
FIG. 1 is a block diagram of a memory system according to a first embodiment.

An embodiment provides a memory system that can improve operation reliability.

In general, according to an embodiment, a memory system includes a nonvolatile semiconductor memory and a controller. The controller is configured to maintain a plurality of log likelihood ratio (LLR) tables for predicting a value of data read from the nonvolatile semiconductor memory, count a number of times that each of write operations, erase operations, and read operations have been carried out with respect to each unit storage region of the nonvolatile semiconductor memory, determine an order in which the LLR tables are referred to, based on the counted number of the read operations and one of the counted number of the write operations and the counted number of the erase operations, which correspond to a target unit storage region of a read operation, and carry out decoding of data read from the target unit storage region of the read operation, using one of the LLR tables selected according to the determined order.

Embodiments will be described below with reference to the drawings. Moreover, in the following description, elements having the same function or configuration are described with the same reference numeral.

1. First Embodiment

A memory system according to a first embodiment is described. As an example, a memory system that includes a NAND flash memory as a semiconductor memory device will be described.

1.1 Configuration

1.1.1 Overall Configuration of the Memory System

First, an overall configuration of the memory system according to the present embodiment is generally described with reference to FIG. 1.

As illustrated, a memory system 1 includes a NAND flash memory 100 and a controller 200. The NAND flash memory 100 and the controller 200 may configure a single semiconductor device, and examples of such device include a memory card, such as a SD™ card, a solid state drive (SSD), and the like.

The NAND flash memory 100 includes a plurality of memory cells and stores data in a nonvolatile manner. The controller 200 is connected to the NAND flash memory 100 via a NAND bus and to a host apparatus 300 via a host bus.

The controller 200 controls the NAND flash memory 100, that is, in response to a command that is received from the host apparatus 300, accesses the NAND flash memory 100. The host apparatus 300 is, for example, a digital camera, a personal computer, or the like, and the host bus is, for example, a bus in compliance with an SD™ interface. The NAND bus performs transmission and reception of a signal conforming to a NAND interface.

1.1.2. Configuration of the Controller 200

A configuration of the controller 200 is described in detail with reference to FIG. 1. As illustrated in FIG. 1, the controller 200 includes a host interface circuit 210, a built-in memory (RAM) 220, a processor (CPU) 230, a buffer memory 240, a NAND interface circuit 250, and an error checking and correcting circuit (ECC) circuit 260.

The host interface circuit 210 is connected to the host apparatus 300 via the host bus and transfers a command and data that are received from the host apparatus 300 to the processor 230 and the buffer memory 240, respectively. Furthermore, in response to a command from the processor 230, data in the buffer memory 240 are transferred to the host apparatus 300.

The processor 230 controls operations of the entire controller 200. For example, in response to a writing command from the host apparatus 300, the processor 230 issues a writing command to the NAND interface circuit 250. This is true also for reading and erasing. Furthermore, the processor 230 performs various processing operations for managing the NAND flash memory 100, such as wear leveling.

The NAND interface circuit 250 is connected to the NAND flash memory 100 via the NAND bus, and manages communication with the NAND flash memory 100. Then, based on a command that is received from the processor 230, the NAND interface circuit 250 transmits various signals to the NAND flash memory 100 and receives various signals from the NAND flash memory 100.

The buffer memory 240 temporarily retains write data and read data.

The built-in memory 220 is a semiconductor memory, for example, such as a DRAM or a SRAM, and is used as a working region for the processor 230. Then, the built-in memory 220 retains firmware for managing the NAND flash memory 100, various management tables, or the like.

The ECC circuit 260 performs error detection and error correction processing relating to data stored in the NAND flash memory 100. That is, the ECC circuit 260 generates an error correction code when writing data, attaches the generated error correction code to the write data, and decodes data when reading the data. As error correction codes, a hard-decision decoded code, such as a BCH code or a Reed-Solomon code (RS), and a soft-decision decoding code, such as a low-density parity-check (LDPC) code, can be used. The ECC circuit 260 will be described in more detail in 1.1.4.

1.1.3 Configuration of the NAND Flash Memory 100

Next, a configuration of the NAND flash memory 100 is described. As illustrated in FIG. 1, the NAND flash memory 100 includes a memory cell array 110, a row decoder 120, a driver circuit 130, a sense amplifier 140, an address register 150, a command register 160, and a sequencer 170.

The memory cell array 110 includes a plurality of blocks BLK each of which includes a plurality of nonvolatile memory cells that are arranged in rows and columns. In FIG. 1, as one example, four blocks BLK0 to BLK3 are illustrated. The memory cell array 110 stores data received from the controller 200.

The row decoder 120 can select any one of the blocks BLK0 to BLK3 and select a row in the selected block BLK.

The driver circuit 130 supplies a voltage to the selected block BLK through the row decoder 120.

When reading data, the sense amplifier 140 senses voltages of data that are read from the memory cell array 110, and performs a necessary arithmetic operation. Then, data DAT (read data) are output to the controller 200. When writing data, write data DAT received from the controller 200 are transferred to the memory cell array 110.

The address register 150 retains an address ADD that is received from the controller 200. The command register 160 retains a command CMD that is received from the controller 200.

Based on the command CMD that is retained in the command register 160, the sequencer 170 controls operations of the entire NAND flash memory 100.

1.1.4 ECC Circuit 260

Figure 2:
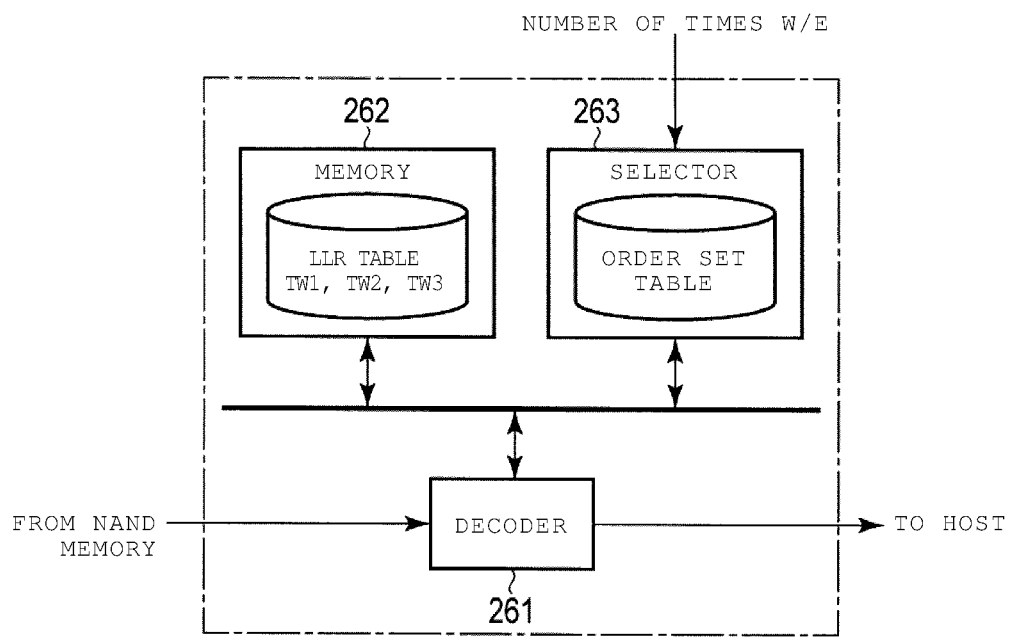
FIG. 2 is a block diagram of an ECC circuit in the memory system according to the first embodiment.

Next, the ECC circuit 260 that is included in the controller 200 is described in detail. FIG. 2 is a block diagram of the ECC circuit 260, in particular elements thereof related to data decoding. As illustrated, the ECC circuit 260 includes a decoder 261, a memory 262, and a selector 263, which are connected to one another in such a manner that communication is possible.

The decoder 261 performs hard-decision decoding processing and soft-decision decoding processing on data read from the NAND flash memory 100, and transmits the decoded data to the host apparatus 300. During the soft-decision decoding processing, based on a log likelihood ratio (LLR), the decoder 261 performs an iterative calculation based on a probability. Then, based on the calculation, an error is detected and corrected. The log likelihood ratio (LLR) is information indicating reliability (probability) of data that are read using a certain read voltage, and is obtained using a log likelihood ratio table (LLR table).

Figure 3:
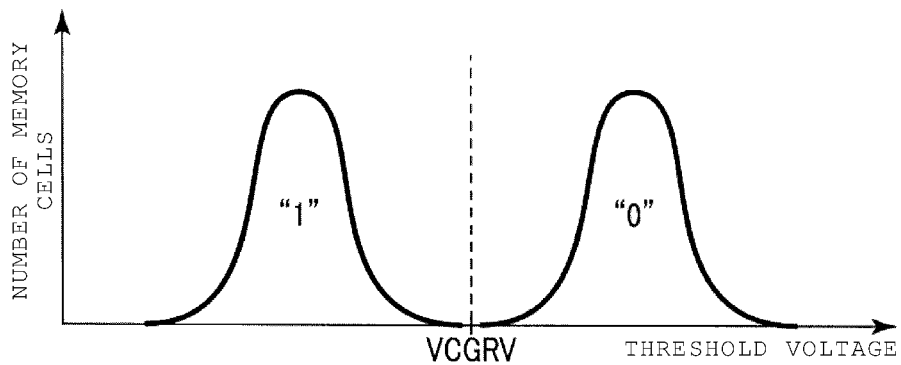
FIG. 3 is a graph illustrating threshold distributions of memory cells.

The LLR table will be briefly described hereinafter. FIG. 3 illustrates threshold distribution of memory cells, and, for brief description, illustrates a case where one-bit data are retained. As described, memory cells retain data according to a threshold voltage. In FIG. 3, memory cells that retain data "1" has a low threshold voltage and memory cells that retain data "0" has a high threshold voltage.

Threshold voltages of memory cells retaining data are distributed within a range up to a given certain width. This is referred to as a threshold distribution. Ideally, it is desirable that a threshold distribution of data "0" and a threshold distribution of data "1" are separated from each other. In this case, as described in FIG. 3, the data "0" and the data "1" can be correctly determined by reading data using a voltage VCGRV between the two threshold distributions as the read voltage.

However, a width of the threshold distribution may broaden due to various reasons after data writing, and, as illustrated in FIG. 4, two threshold distributions may overlap. In a case where the threshold distributions overlap in this manner, a reading error may occur. According to the soft-decision processing, such as the LDPC, which is described above, the ability to correct an error can be improved by performing decoding using the LLR table. The LLR table is a table that indicates a relationship between each range of a threshold voltage and the LLR when the threshold voltage that the memory cell can take is divided into the plurality of ranges. In an example shown in FIG. 4, a range between V1 and V2, a range between V2 to V3, or the like is equivalent to a range of the threshold voltages described above. During the soft-decision processing, soft bit reading is performed. The soft bit reading in FIG. 4 is a reading operation using voltages V1 to V7 as the read voltage. With a soft bit obtained through this soft bit reading, a range of the threshold voltages described above that are among threshold voltages of each memory cell can be known, and the LLR that corresponds to the range of the threshold voltages can be obtained by referring to the LLR table.

The configuration of the ECC circuit 260 is described with reference back to FIG. 2. The memory 262 is, for example, a volatile or nonvolatile semiconductor memory, and retains the LLR table described above. In the present embodiment, a plurality of LLR tables (three LLR tables in FIG. 2), LLR tables TW1, TW2, and TW3, are retained. These LLR tables TW are created in advance considering a threshold change due to the writing and the erasing.

As described above, the threshold distribution changes due to various influences. Therefore, for example, the LLR table that is suitable for the threshold distribution illustrated in FIG. 4 may not be suitable when the threshold distribution in FIG. 4 changes.

Furthermore, there are various ways in which the threshold distribution changes, depending on a cause of the change. For example, a write operation that is performed on cells may widen threshold distributions of other memory cells to the high voltage side. This state is illustrated in FIG. 5. As illustrated, a shape of the threshold distribution changes in such a manner that the upper edge thereof widens. In the present example, a plurality of LLR tables TW is prepared considering an influence due to writing and erasing operations. More specifically, the LLR tables TW1, TW2, and TW3, for example, are optimized according to the number of times a write operation and an erasing operation are performed on the block BLK.

The configuration of the ECC circuit 260 is described with reference back to FIG. 2. The selector 263, for example, includes a volatile or nonvolatile semiconductor memory therein, and retains an order set table in the internal semiconductor memory. Additionally, based on this order set table, one of the LLR tables TW1, TW2, and TW3 in the memory 262 is selected, and the LLR table to be used for the data decoding is notified to the decoder 261. FIG. 6 illustrates a structure of the order set table.

As illustrated, in the order set table according to the present embodiment, the order in which the LLR tables TW1, TW2, and TW3 are used is defined for each of the six types of conditions (conditions A to F). That is, in the condition A, the LLR table TW1 is used first, TW2 next, and, TW3 last. In the condition B, the LLR table TW1 is use first, TW3 next, and, TW2 last.

Each of the conditions A to F is, for example, the number of times (which is expressed as the number of times W/E) at least one of the write operation and the erasing operation is performed on a reading-target block BLK. Specifically, for example, the conditions A to F are as follows.

Condition A: the number of times W/E=0 to 200
Condition B: the number of times W/E=201 to 400
Condition C: the number of times W/E=401 to 600
Condition D: the number of times W/E=601 to 800
Condition E: the number of times W/E=801 to 1000
Condition F: the number of times W/E=1001 or more Furthermore, various methods can be employed to count the number of times W/E. The block is basically a unit for erasing, and data in the same block are collectively erased. In this case, the number of times the erasing operation is performed on the block, as is, can be counted as the number of times of the erasing. However, for example, in the case of a three-dimensionally-stacked NAND flash memory including memory cells stacked three-dimensionally on top of one another, it is also possible that the erasing is performed in units each less than a block size. In such a case, in a certain block, the numbers of times the erasing is performed in the units each less than the block size may be counted, and the counted numbers of times may be counted as the number of times the block is erased. This erasure method is disclosed, for example, in U.S. patent application Ser. No. 13/235,389 titled "NON VOLATILE SEMICONDUCTOR MEMORY DEVICE", which is filed on Sep. 18, 2011. Furthermore, the erasure method is disclosed in U.S. patent application Ser. No. 12/694,690 titled "NON-VOLATILE SEMICONDUCTOR STORAGE DEVICE", which filed on Jan. 27, 2010. Moreover, the erasure method is disclosed in U.S. patent application Ser. No. 13/483,610 titled ""NONVOLATILE SEMICONDUCTOR MEMORY DEVICE AND DATA ERASE METHOD THEREOF", which is filed on May 30, 2012. These Patent Applications are incorporated in their entireties herein by reference.

Furthermore, as to a method of counting the write operation, for example, when data are written to an arbitrary page of a certain block, this may be counted as one time. When data are further written to another page of the certain block, this may be counted as two times. The numbers of times the writing is performed on the same block may be accumulated (a method of performing the counting in page units). Alternatively, there is also a method (a method of performing the counting in block units). According to the method, when data are written to an arbitrary page of the block, this is counted as one time. However, even if writing is performed on another page without the erasing of the block (or the erasing of a region smaller than a block, which includes the arbitrary page) being performed thereafter, the writing is not counted as one time. In the latter case, the number of times of the erasing and the number of times of the writing can be the same.

1.2 Operation

Figure 7:
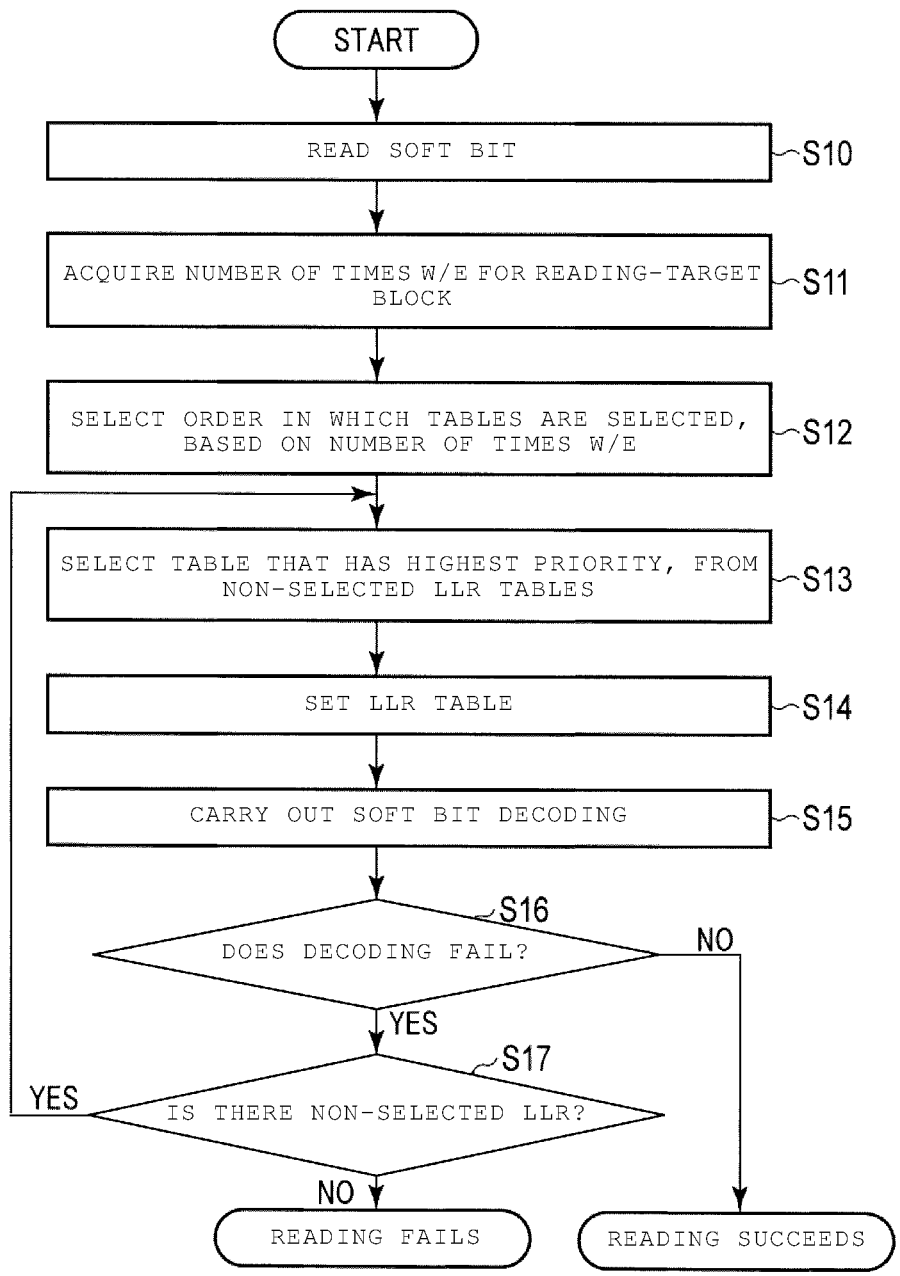
FIG. 7 is a flowchart illustrating soft-decision processing according to the first embodiment.

Next, a data read operation in the memory system 1 of the configuration described above is described with a focus particularly on a soft-decision operation in the ECC circuit 260. FIG. 7 is a flowchart of the soft-decision operation.

As illustrated, first, the soft bit reading is performed (Step S10). That is, the processor 230 of the controller 200 transmits a block address and a page address of a reading-target region to the NAND flash memory 100, along with a soft bit reading command. When this operation is completed, in the NAND flash memory 100, the row decoder 120 selects one of the pages, and, for example, as described in the example in FIG. 4, a plurality of voltages V1 to V7 are applied as read voltages. Then, the sense amplifier 140 senses data (soft bits) that are read using these voltages V1 to V7, and then the read data are transmitted to the controller 200.

Next, the selector 263 of the ECC circuit 260 acquires the number of times W/E corresponding to the reading-target block BLK (Step S11). The number of times W/E corresponding to each block BLK, for example, is retained, as a table, in the memory 220. Based on a physical address of the reading-target block BLK, the processor 230 reads the number of times W/E from the memory 220, and transfers the number of times W/E, which is read, to the selector 263.

When this operation is completed, based on the order set table illustrated in FIG. 6, the selector 263 selects a table application order (Step S12). That is, which of the conditions A to F in FIG. 6 corresponds to the number of times W/E acquired in Step S11 is determined, and the corresponding table application order is selected.

Then, based on the table application order that is selected in Step S12, the selector 263 selects the highest-priority LLR table from the not-selected LLR tables (Step S13). For example, in a case where the table application order that corresponds to the condition A in FIG. 6 is selected, the highest-priority LLR table is the table TW1, the next highest-priority LLR table is the table TW2, and the lowest-priority LLR table is the table TW3. It is here assumed that the table TW1 is selected. Then, the selector 263 reads the table TW1 from the memory 262, and sets the read table TW1 for the decoder 261 (Step S14).

When this step is completed, the decoder 261 decodes (performs soft bit decoding on) the read data, which are received from the NAND flash memory 100, using the LLR table TW1 (Step S15). If the decoding succeeds (NO in Step S16), the read operation is successful, and the processing ends.

In a case where the decoding fails (YES in Step S16), if there is a non-selected LLR table (YES in Step S17), the process returns to Step S13, and the soft bit decoding is performed using the next-priority LLR table TW2 (Steps S13 to S15). In a case where there is no non-selected LLR table (NO in Step S17), that is, when the decoding using any one of the three LLR tables TW1, TW2, and TW3 failed, the reading is regarded as a failure, and processing ends.

1.3 Effect According to the First Embodiment

According to the first embodiment, in the soft-decision processing for the read operation, an optimal LLR table can be selected according to the number of times W/E corresponding to the reading-target block BLK. For this reason, the time for error correction can be shortened and a data transfer speed in the memory system 1 can be improved.

As a NAND flash memory becomes more precise, higher correction ability is required for an ECC circuit mounted in a controller of the NAND flash memory. In order to realize the higher correction ability, an ECC circuit that performs flexible determination such as the LDPC is more likely to be mounted in the controller.

Figure 8:
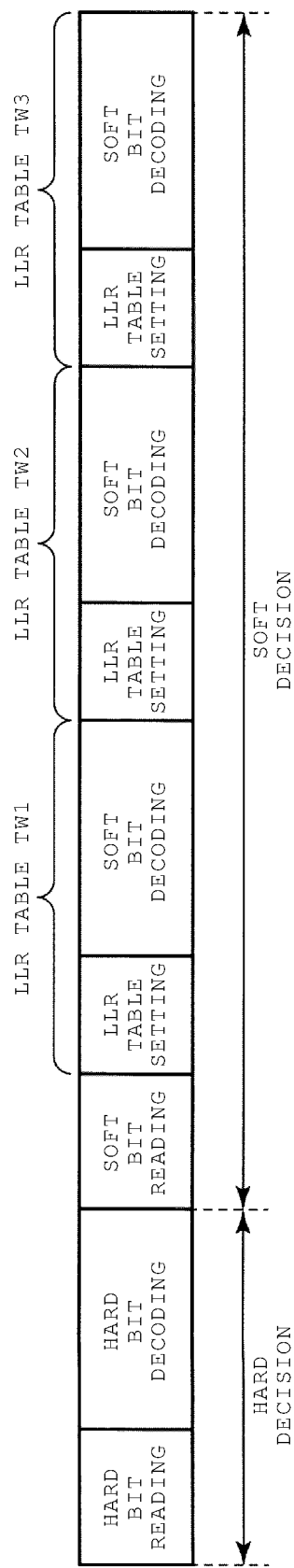
FIG. 8 illustrates a sequence of data reading according to the first embodiment.

Before performing the soft decision, hard-decision processing is performed. FIG. 8 is a conceptual diagram illustrating a flow of the hard-decision and soft-decision processing. During the hard-decision processing, hard bit reading is performed first. The hard bit reading is different from the soft bit reading, and data are read using one read voltage that is set in advance (a read voltage assumed to be optimal). Then, the hard bit decoding processing is performed on the read data.

In a case where an error cannot be corrected by the hard bit decoding, then the soft-decision processing is performed. The soft bit reading is performed first, and the soft bit reading is performed next. On this occasion, according to the present embodiment, a plurality of LLR tables TW in consideration of the number of times W/E are prepared, and information of the LLR table TW that is suitable for the error correction according to the number of times W/E is prepared as the order set table. Generally, as a physical property of the NAND flash memory, the number of times W/E influences on the threshold distribution. For that reason, based on the order set table and the number of times W/E, the ECC circuit according to the present embodiment makes a selection in sequential order among the prepared LLR tables TW, and performs the soft bit decoding. That is, the plurality of LLR tables TW are prepared, but it is highly likely that the decoding using the LLR table that is used first succeeds.

Furthermore, generally, a time period required to perform the soft bit decoding one time is longer than a time period required to perform the hard bit decoding. Therefore, when the plurality of LLR tables is used in the soft decision, the time period required to perform the read operation may be considerably lengthened. For example, in the case of data that are difficult to correct, an influence of the above concern is remarkable. However, according to the present embodiment, the LLR table suitable for the block in which data are retained is used in sequential order. Therefore, the number of times of the soft bit decoding can be effectively reduced, and the reading speed can be improved. This can lead to a remarkable effect on a host device for which maximum latency to return the read data from the NAND flash memory is regulated.

According to the present embodiment as described above, high-speed reading is possible by preparing the plurality of LLR tables in consideration of the number of times W/E and by dynamically changing priority levels of the LLR tables according to the number of times W/E for the reading-target block.

2. Second Embodiment

Next, a memory system according to a second embodiment is described. According to the second embodiment, instead of the number of times W/E used in the first embodiment described above, the LLR tables are prepared according to the number of times of reading and one of them is selected. Only differences with the first embodiment will be described below.

2.1 ECC Circuit 260

FIG. 9 is a block diagram of the ECC circuit 260 according to the present embodiment, in particular, elements related to the data decoding.

A difference of a configuration according to the present embodiment from the configuration according to the first embodiment illustrated in FIG. 2, is that the memory 262 has a plurality of LLR tables TR1, TR2, and TR3 (three LLR tables in an example in FIG. 9) that are created in consideration of the threshold change due to the read operation instead of the writing and the erasing. That is, the LLR tables TR1, TR2, and TR3 are optimized, for example, according to the number of times the read operation is performed on the block BLK.

Furthermore, as illustrated in FIG. 10, orders in which the LLR tables TR1, TR2, and TR3 are used are defined for each of the six types of conditions (conditions G to L) in the selector 263. That is, in the condition G, the LLR table TR1 is used first, the TR2 next, and the TR3 last. Then, each of the conditions G to L is the number of times the read operation is performed on the reading-target block BLK. Specifically, for example, the conditions G to L are as follows.

Condition G: the number of times of reading=0 to 300
Condition H: the number of times of reading=301 to 600
Condition I: the number of times of reading=601 to 900

Condition J: the number of times of reading=901 to 1200

Condition K: the number of times of reading=1201 to 1500

Condition L: the number of times of reading=1501 or more

2.2 Operation

Figure 11:
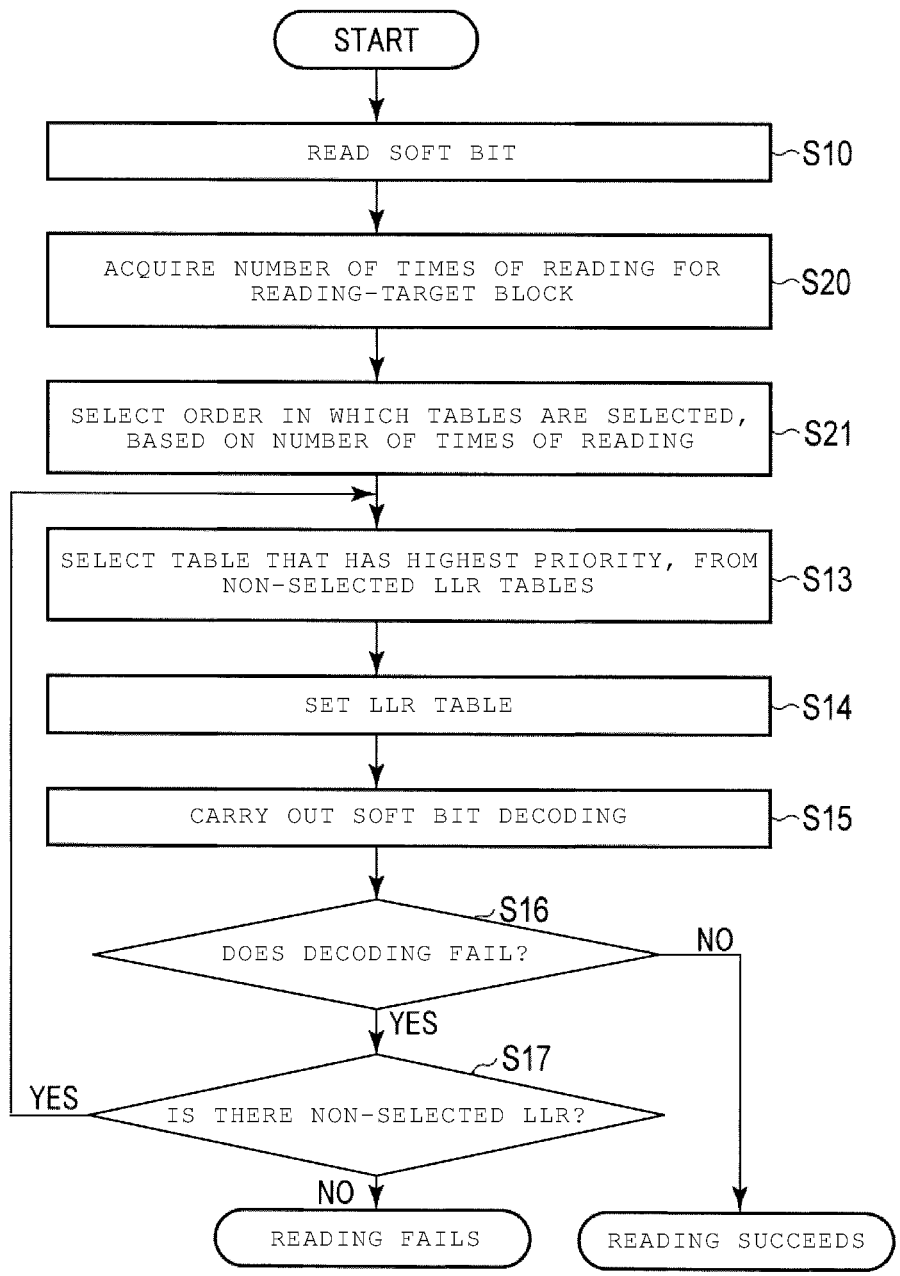
FIG. 11 is a flowchart illustrating soft-decision processing according to the second embodiment.

Next, the data read operation in the memory system 1 of the configuration described above is described with a focus particularly on the soft-decision operation in the ECC circuit 260. FIG. 11 is a flowchart for the soft-decision operation.

As illustrated, a difference of the present embodiment from the first embodiment illustrated in FIG. 7 is described below.

That is, after Step S10, the selector 263 acquires the number of times the reading is performed on the reading-target block BLK (Step S20). That is, the number of times the reading is performed on every block BLK, for example, is retained as a table in the memory 220. Based on the physical address of the reading-target block BLK, the processor 230 reads the number of times of reading from the memory 220, and transfers the read number of times of reading to the selector 263.

Subsequently to Step S20, based on the order set table illustrated in FIG. 10, the selector 263 selects one of the LLR tables in accordance with the table application order (Step S21). That is, based on one of the conditions G to L corresponding to the number of times of reading that is acquired in Step S20, the corresponding table application order is applied.

The others are the same as in the first embodiment. Moreover, the LLR table that is used in Steps S13 to S15 is one of the LLR tables TR1, TR2, and TR3 that are prepared in consideration of the number of the read operation.

2.3 Effect According to the Present Embodiment

In the NAND flash memory, the read operation also has an influence on the threshold distribution in the same manner as the write operation and the erasing operation. Then, in some cases, a way of exerting the influence and the degree of the influence are different from those in the write operation and the erasing operation.

Accordingly, according to the present embodiment, a plurality of LLR tables TR are prepared based on the number of times of reading, and information indicating the LLR table TR that is suitable for the error correction according to the number of times of reading is prepared as the order set table. The high-speed reading is possible by dynamically changing the priority levels of the LLR tables to be used according to the number of times the reading is performed on the reading-target block.

3. Third Embodiment

Next, a memory system according to a third embodiment is described. The third embodiment is a combination of the first embodiment and the second embodiment. According to the third embodiment, the LLR tables are prepared according to both of the number of times W/E and the number of times of reading and one of them is selected. Only differences with the first and second embodiments will be described below with two methods of specifying the present embodiment being taken as examples. Moreover, as described above, the number of times W/E may be the number of times at least one of the write operation and the erasing operation, and may be the number of times corresponding to a sum of the number of times of the write operation and the number of times of the erasing operation. This is the same in embodiments subsequent to the third embodiment.

3.1 First Example

First, a first example is described. In the first example, two types of LLR tables, that is, a LLR table TW that is created in consideration of the writing and the erasing and a LLR table TR that is created in consideration of the reading, are used.

3.1.1 ECC Circuit 260

Figures 12, 13:
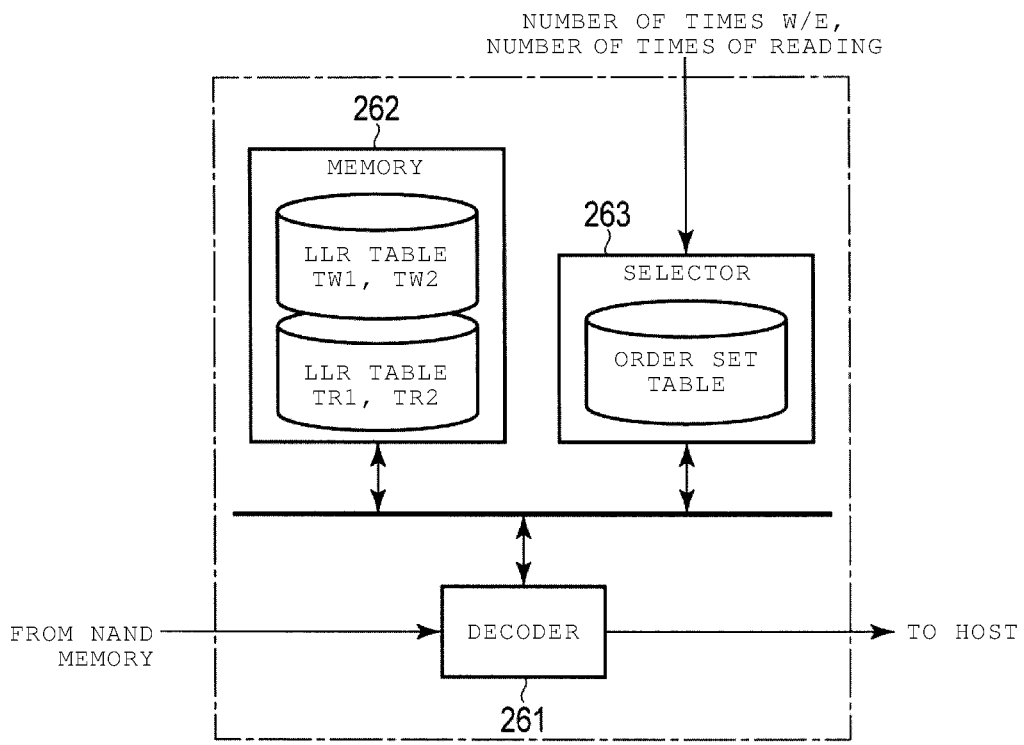
FIG. 12 is a block diagram of an ECC circuit according to a third embodiment.
FIG. 13 illustrates a structure of an order set table according to the third embodiment.

FIG. 12 is a block diagram of the ECC circuit 260 according to the present example, in particular, elements related to the data decoding.

A difference of a configuration according to the present example from the configurations according to the first and second embodiments illustrated in FIGS. 2 and 9, respectively, is that the memory 262 has a plurality of LLR tables TW1 and TW2 (two LLR tables in FIG. 12) that are created in consideration of the threshold change due to the writing and erasing operations, and a plurality of LLR tables TR1 and TR2 (two tables in FIG. 12) that are created in consideration of the change in threshold due to the read operation. That is, the LLR tables TW1 and TW2 are optimized according to the number of times W/E, and the LLR tables TR1 and TR2 are optimized according to the number of times of read operations.

Furthermore, as illustrated in FIG. 13, orders in which the LLR tables TW1, TW2, TR1, and TR2 are used are defined for each of the combinations of the numbers of times W/E and the numbers of times of reading in the order set table stored in the selector 263. That is, as illustrated in FIG. 13, in a case where both of the number of times W/E and the number of times of reading are small, the LLR table TW1 is used first, TR1 next, TW2 next, and TR2 last. Furthermore, in a case where the number of times W/E is small and the number of times of reading is large, the LLR table TR1 is used first, TR2 next, TW1 next, and TW2 last. In a case where the number of times W/E is large and the number of times of reading is small, the LLR table TW1 is used first, TW2 next, TR1 next, and TR2 last. In a case where both of the number of times W/E and the number of times of reading are large, the LLR table TW2 is used first, TR2 next, TW1 next, and TR1 last.

Moreover, whether the number of times W/E is large or small, or whether the number of times of reading is large or small can be determined, for example, based on the following reference. Of course, the following reference is only one example.

The number of times W/E is smaller than 500: the number of times W/E=small

The number of times W/E is equal to or larger than 500: the number of times W/E=large The number of times of reading is smaller than 1000: the number of times of reading=small The number of times of reading is equal to larger than 1000: the number of times of reading=large

3.1.2 Operation

Figure 14:
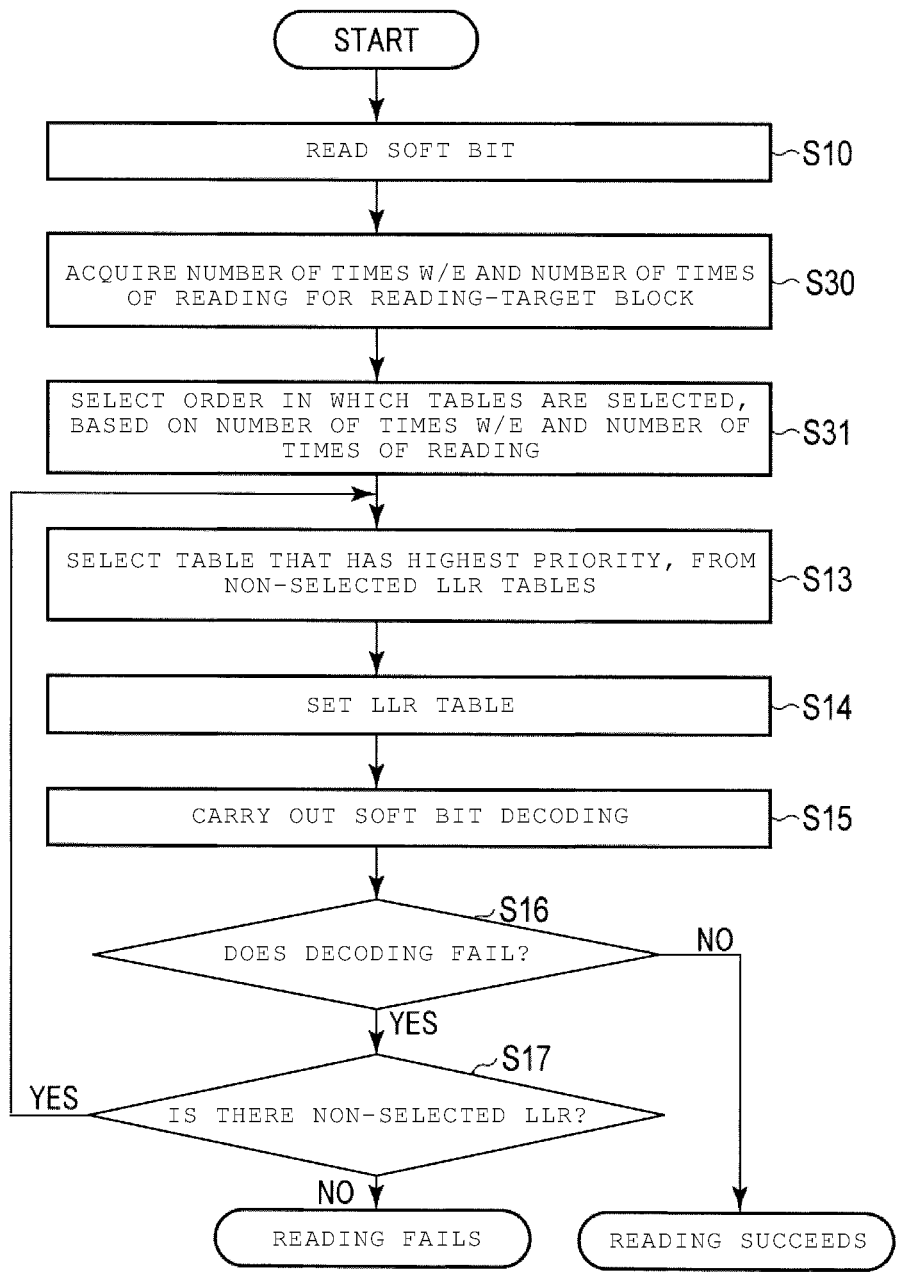
FIG. 14 is a flowchart illustrating soft-decision processing according to the third embodiment.

Next, the data read operation in the memory system 1 of the configuration described above is described with a focus particularly on the soft-decision operation in the ECC circuit 260. FIG. 14 is a flowchart of the soft-decision operation.

As illustrated, a difference of the present example from the first and second embodiments illustrated in FIGS. 7 and 11, respectively, is described below.

That is, after Step S10, the selector 263 acquires the number of times W/E for the reading-target block BLK and the number of times of reading (Step S30). That is, the number of times W/E and the number of times of reading are retained for each block BLK as tables in the memory 220. That is, based on the physical address of the reading-target block BLK, the processor 230 reads both of the number of times W/E and the number of times of reading from the memory 220, and transfers the number of times of W/E and the number of times of reading, which are read, to the selector 263.

Subsequently to Step S30, based on the order set table illustrated FIG. 13, the selector 263 selects one of the LLR tables in accordance with the table application order (Step S31). That is, based on one of the conditions in FIG. 13 corresponding to the number of times W/E and the number of times of reading, which are acquired in Step S30, the corresponding table application order is applied.

The others are the same as in the first embodiment. Here, the LLR table used in Steps S13 to S15 is one of the LLR tables TW1 and TW2 that are created in consideration of the writing and erasing operations or one of the LLR tables TR1 and TR2 that are created in consideration of the read operation.

3.2 Second Example

Next, a second example is described. In the second example, a plurality of LLR tables TWR created in consideration of three operations, that is, the writing, the erasing, and the reading is used.

3.2.1 ECC Circuit 260

Figures 15, 16:
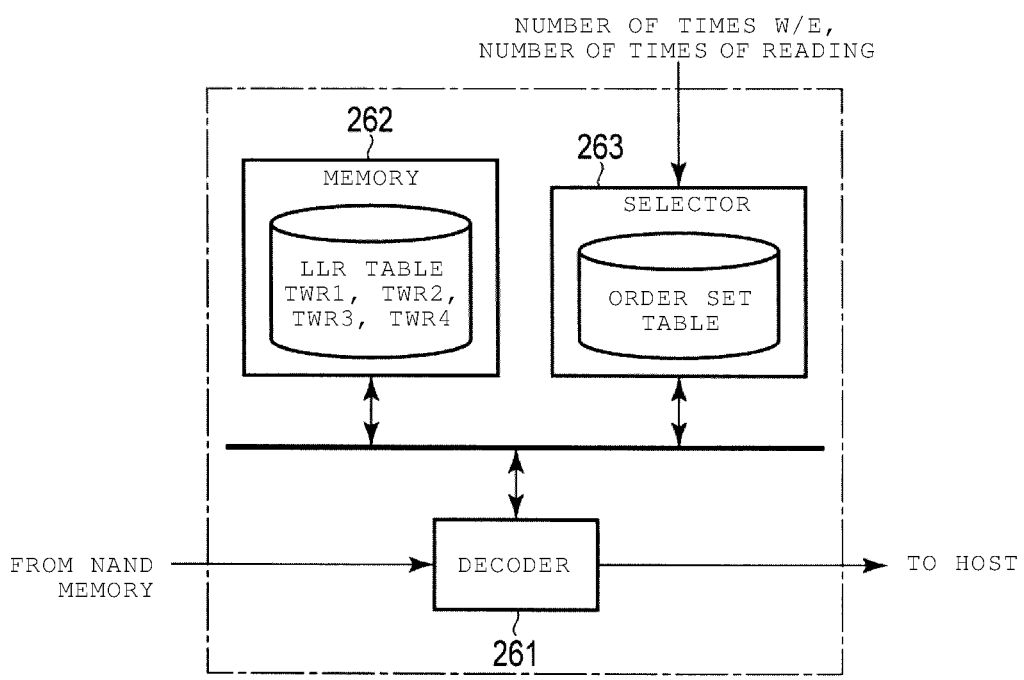
FIG. 15 is a block diagram of the ECC circuit according to the third embodiment.
FIG. 16 illustrates a structure of the order set table according to the third embodiment.

FIG. 15 is a block diagram of the ECC circuit 260 according to the present example, in particular, elements related to the data decoding.

A difference of the configuration according to the present example from the configuration according to the first example illustrated in FIG. 12, is that the memory 262 has a plurality of LLR tables TWR1, TWR2, TWR3, and TWR4 (four LLR tables in an example in FIG. 15) that are created, in consideration of the threshold change due to three operations, that is, the writing, erasing, and read operations. That is, each of these four LLR tables TWR1, TWR2, TWR3, and TWR4 is optimized according to both of the number of times W/E and the number of times of reading.

Furthermore, as illustrated in FIG. 16, orders in which the LLR tables TWR1, TWR2, TWR3, and TWR4 are used are defined for each combination of the numbers of times W/E and the numbers of times of reading in the order set table stored in the selector 263. That is, in FIG. 16, in a case where both of the number of times W/E and the number of times of reading are small, the LLR tables are used in this order: TWR1, TWR2, TWR3, TWR4. In a case where the number of times W/E is small and the number of times of reading is large, the LLR tables are used in this order: TWR2, TWR1, TWR4, and TWR3. A criteria to determine whether the number of times W/E and the number of times of reading are large or small, for example, is the same as the first example.

3.2.2. Operation

A soft-decision operation relating to the present example is same as the one described in the first example with reference to FIG. 14.

3.3 Effect According to the Third Embodiment

According to the third embodiment, an optimal LLR table can be selected based on both of the number of times W/E and the number of times of reading that are carried out in the NAND flash memory. Therefore, preciseness of correction can be improved further than in the first and second embodiments. Moreover, in FIGS. 13 and 16, two types of cases are illustrated as conditions, that is, the case where the number of times W/E and the number of times of reading are small and the case where the number of times W/E and the number of times of reading are large, are described as examples. However, three or more cases may be set as the conditions, such as a case where the number of times W/E and the number of times of reading are approximately at an intermediate level between small and large.

4. Fourth Embodiment

Next, a memory system according to a fourth embodiment is described. According to the fourth embodiment, the LLR table is selected according to the physical address, that is, a position of the reading-target region, instead of the number of times W/E according to the first embodiment described above. Only a difference with the first embodiment will be described below.

4.1 ECC Circuit 260

Figures 17, 18:
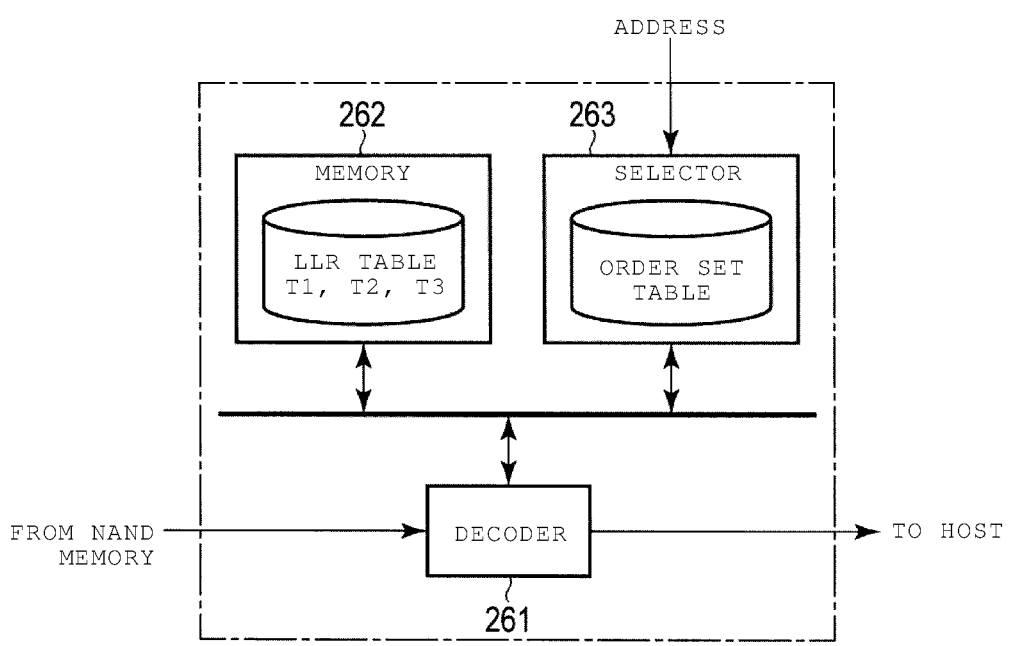
FIG. 17 is a block diagram of an ECC circuit according to a fourth embodiment.
FIG. 18 illustrates a structure of an order set table according to the fourth embodiment.

FIG. 17 is a block diagram of the ECC circuit 260 according to the present embodiment, in particular, elements related to the data decoding.

A difference of a configuration according to the present embodiment from the configuration according to the first embodiment illustrated in FIG. 2 is that a plurality of LLR tables T1, T2, and T3 (three LLR tables in an example in FIG. 17) that is stored in the memory 262 are not limited to the ones that are prepared in consideration of the number of times W/E and the number of times of reading. For example, the LLR table T1 may correspond to an average threshold distribution within a memory cell array, and the other LLR tables T2 and T3 may be different from the LLR table T1 and be different from each other.

Furthermore, an order in which one of the three LLR tables T1, T2, and T3 are used is defined in the order set table stored in the selector 263, for each of physical addresses of a region that is accessed for reading, as illustrated in FIG. 18. That is, in a case where the physical address designates a first region, the LLR table applies in this order: T1, T2, T3. In a case where a second region different from the first region is designated, the LLR table applies in this order: T2, T1, T3. In a case where a third region different from the first and second regions is designated, the LLR table applies in this order: T3, T2, T1.

4.2 Operation

Figure 19:
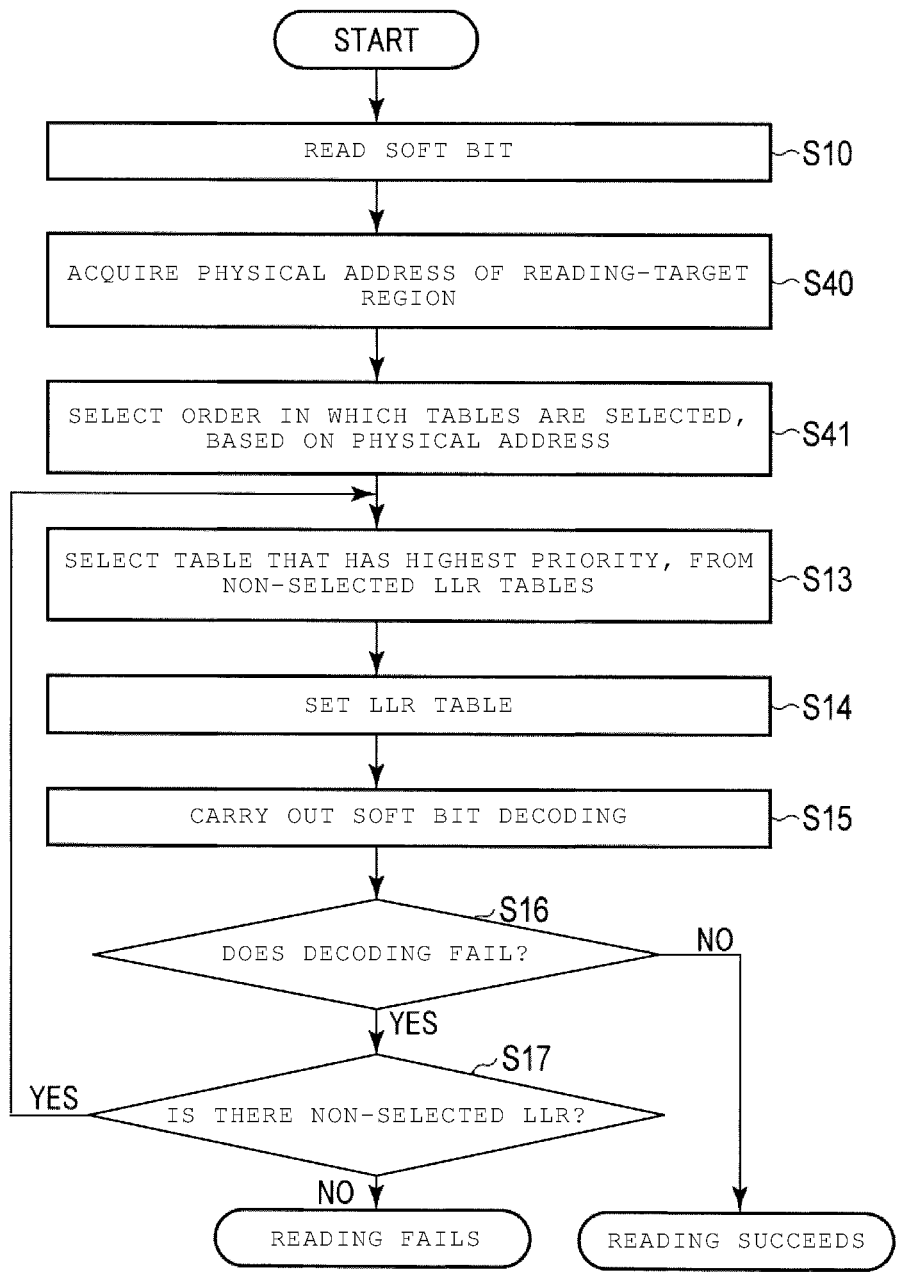
FIG. 19 is a flowchart illustrating soft-decision processing according to the fourth embodiment.

Next, the data read operation in the memory system 1 of the configuration described above is described with a focus particularly on the soft-decision operation in the ECC circuit 260. FIG. 19 is a flowchart of the soft-decision operation.

As illustrated, a difference of the present embodiment from the first embodiment illustrated in FIG. 7 is described below.

That is, after Step S10, the selector 263 acquires the physical address of the reading-target region (Step S40). The host apparatus 300 issues a reading command to the controller 200 using a logical address. The controller 200 maintains a table showing a relationship between (i) this logical address and (ii) a physical address of a block BLK and a page in the memory cell array 110 of the NAND flash memory 100, for example, in the memory 220. Then, for example, the processor 230 converts the logical address into the physical address using this table, and issues the reading command to the NAND flash memory 100. The processor 230 transmits the physical address that is obtained in this manner, also to the selector 263 of the ECC circuit 260.

Subsequently to Step S40, based on the order set table illustrated in FIG. 18, the selector 263 selects one of the LLR tables in accordance with the table application order (Step S41). That is, the corresponding table application order is selected according a region that is designated by the received physical address.

The others are the same as in the first embodiment. Moreover, the LLR table that is used in Steps S13 to S15 is one of the LLR tables T1, T2, and T3.

4.3 Specific Example

Next, specific examples of the first and third regions that are described with reference to FIG. 18 is briefly described.

4.3.1 First Example

Figure 20:
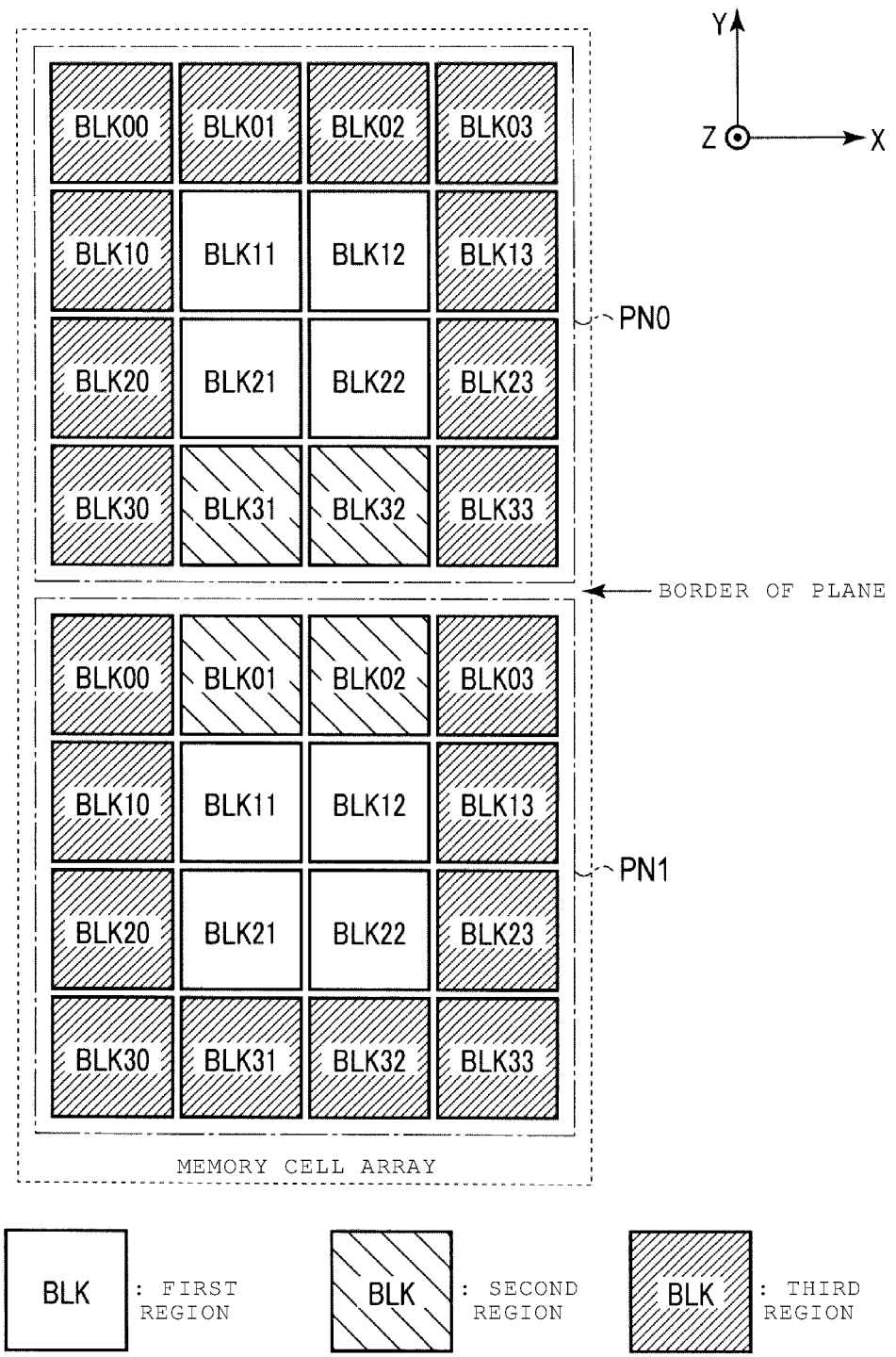
FIG. 20 illustrates a plane layout of memory cell arrays according to the fourth embodiment.

A first example corresponds to a case where a region is designated on a per-block basis. FIG. 20 illustrates one example of a plane layout of a block BLK in the memory cell array 110. In the present example, the memory cell array 110 includes two planes PN0 and PN1, and each of the planes includes 16 blocks BLK00 to BLK33.

In the present example, the blocks BLK that have the most excellent property are surrounded by other blocks, and are blocks (a block BLK11, BLK12, BLK21, or BLK22 in the planes PN0 and PN1) that are not positioned at the border of the plane. These blocks are equivalent to the first region.

The blocks BLK that have the next most excellent property are surrounded by other blocks, but are blocks (a block BLK31 or BLK32 in the plane PN0, or a block BLK01 or BLK02 in the plane PN1) that are positioned at the border of the plane. These blocks are equivalent to the second region.

Blocks (blocks BLK00, BLK01, BLK02, BLK03, BLK10, BLK13, BLK20, BLK23, BLK30, and BLK33 in the plane PN0, and blocks BLK00, BLK03, BLK10, BLK13, BLK20, BLK23, BLK30, BLK31, BLK32, and BLK33 in the plane PN0) that are positioned at the end portion of the memory cell array 110 have disrupted regularity in a block layout, and thus have comparatively-poor property. These blocks are equivalent to the third region.

As described above, the order in which one of the LLR tables is selected may be changed according to a position of the block BLK.

4.3.2 Second Example

Figure 21:
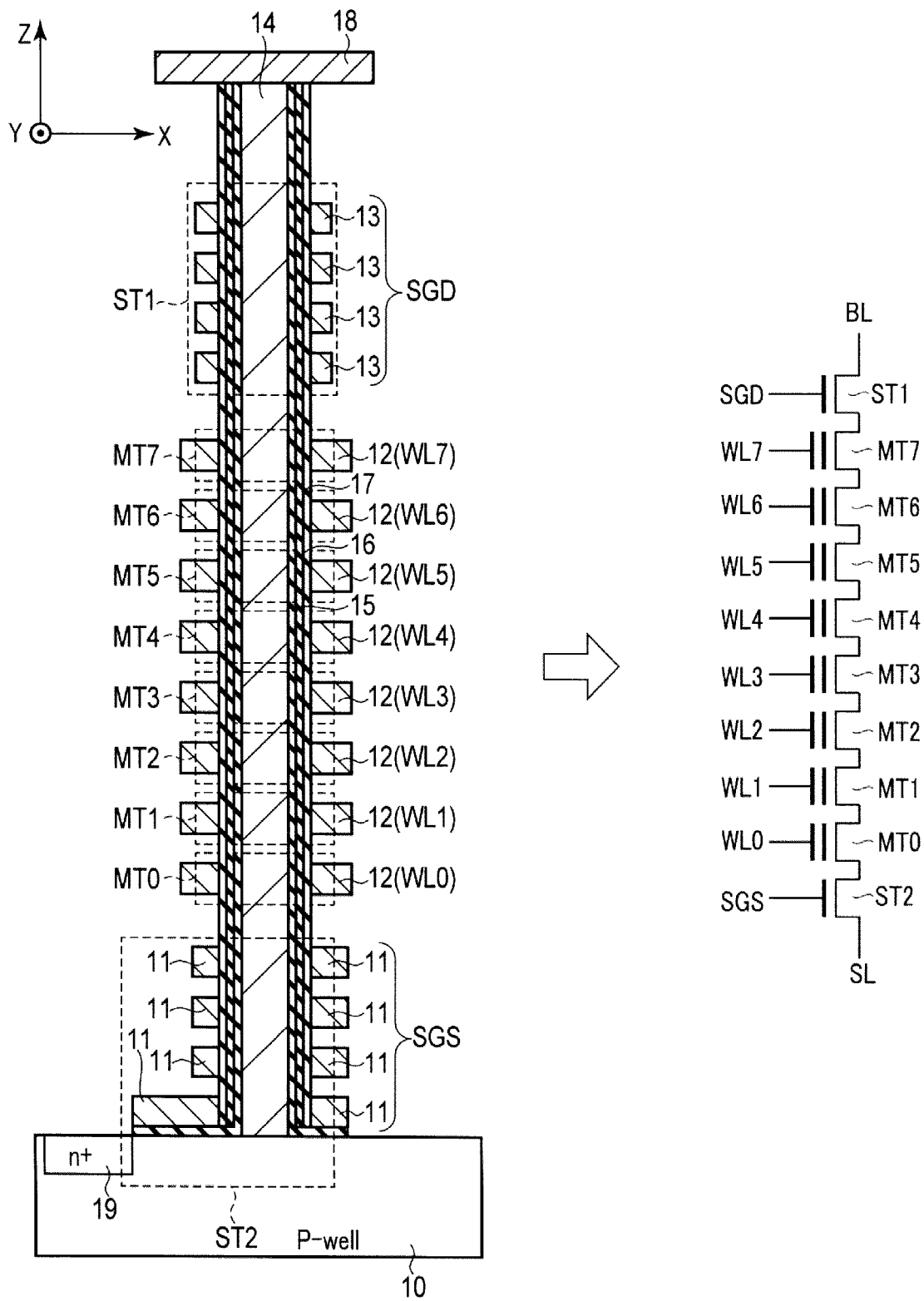
FIG. 21 is a cross-sectional diagram and an equivalent circuit diagram of a NAND string according to the fourth embodiment.

A second example corresponds to a case where a region is designated on a per-word line basis. FIG. 21 is a cross-sectional diagram of a NAND cell that is included in each block BLK, and is an equivalent-circuit diagram thereof. As one example, FIG. 21 illustrates a configuration in which a NAND string has eight memory cell transistors MT0 to MT7, and in which select transistors ST0 to ST1 and a memory cell transistor MT are stacked above a semiconductor substrate.

As described, four-layered inter-connection layer 11 that functions as a select gate line SGS, an eight-layered inter-connection layer 12 that functions as word lines WL0 to WL7, and four-layered inter-connection layer 13 that functions as a select gate line SGD are sequentially stacked on a p-type well region 10. An insulating film, which is not illustrated, is formed between each of the inter-connection layers that are stacked on top of one another.

Then, a pillar-shaped conductor 14 is formed so as to pass through these inter-connection layers 13, 12, and 11 and reach the well region 10. A gate insulating film 15, a charge storage layer (an insulating film or a conductive film) 16, and a block insulating film 17 are formed on a flank surface of the conductor 14, and the memory cell transistor MT and the select transistors ST1 and ST2 are formed as a result. The conductor 14 functions as an electric current path for the NAND string and is a region in which a channel of each transistor is formed. Then, the upper end of the conductor 14 is connected to a metal inter-connection layer 18 that functions as a bit line BL which extends to the NAND string and the sense amplifier 140. Moreover, a n+ type impurity diffusion layer 19 is formed within a surface region of the well region 10, and the diffusion layer 19 is connected to a source line SL, which is not illustrated.

A plurality of configurations, each of which is described above, is arranged in horizontal directions and a depth direction of paper on which FIG. 21 is drawn, and the block BLK is formed by a set of a plurality of the NAND strings. The block BLK, for example, is a unit for erasing, but data may be erased in units smaller than the block BLK.

The configuration of the memory cell array 110 may be other configurations. The other configuration of the memory cell array 110 is disclosed, for example, in U.S. patent application Ser. No. 12/407,403 filed on Mar. 19, 2009, which is titled "THREE-DIMENSIONAL STACKED NON-VOLATILE SEMICONDUCTOR MEMORY". Furthermore, a configuration of the memory cell array 110 is disclosed in U.S. patent application Ser. No. 12/406,524, filed on Mar. 18, 2009, which is titled THREE DIMENSIONAL STACKED NONVOLATILE SEMICONDUCTOR MEMORY, U.S. patent application Ser. No. 12/679, 991, filed on Mar. 25, 2010, which is titled "NON-VOLATILE SEMICONDUCTOR MEMORY DEVICE AND METHOD OF MANUFACTURING THE SAME", and U.S. patent application Ser. No. 12/532,030, filed on Mar. 23, 2009, which is titled "SEMICONDUCTOR MEMORY AND METHOD FOR MANUFACTURING THE SAME". These Patent Applications are incorporated in their entireties herein by reference.

In the present example, a memory cell that corresponds to a word line WL that is not adjacent to the select gate lines SGD and SGS, that is, a word line WL that is vertically disposed between other word lines WL, has excellent property. For that reason, for example, word lines WL1 to WL6 are equivalent to the first region, a word line WL7 that is adjacent to the select gate line SGD is equivalent to the second region, and a word line WL0 that is adjacent to the select gate line SGS is equivalent to the third region. Of course, each of the second and third regions may include a plurality of word lines WL.

In this manner, the order in which one of the LLR tables is used may be changed according to a position of the word line WL to be accessed.

4.4 Effect According to the Present Embodiment

Property of a memory cell may vary according to a physical position in the NAND flash memory. According to the present embodiment, the high-speed reading is possible by dynamically switching to the suitable LLR table according to the physical position of the reading-target region.

Moreover, the LLR tables in the present example may be created in consideration of a position within the memory cell array. Then, one the LLR tables may be selected in such a manner that a region which is actually accessed and the position considered when the LLR table is created are consistent with each other.

5. Fifth Embodiment

Next, a memory system according to a fifth embodiment is described. Unlike in the first to fourth embodiments, in the fifth embodiment, an optimal LLR table is selected based on past correction history information for each LLR table, not based on the order set table that is prepared in advance. Only a difference with the first and fourth embodiments will be described below.

5.1 ECC Circuit 260

FIG. 22 is a block diagram of the ECC circuit 260 according to the present embodiment, in particular, elements related to the data decoding.

As illustrated, the memory 262 according to the present embodiment includes a plurality of LLR tables T1, T2, T3, ... Tn (n tables in FIG. 17, and n is a natural number that is equal to or larger than 2). These LLR tables T1 to Tn are not limited to ones that are prepared in consideration of the number of times W/E and the number of times of reading, in the same manner as in the fourth embodiment.

As described above, in the same manner as in the first embodiment, the decoder 261 performs the hard-decision decoding processing and the soft-decision decoding processing on data read from the NAND flash memory 100, and transmits the decoded data to the host apparatus 300. On this occasion, during the soft-decision decoding processing, data are decoded using any one of the LLR tables T1 to Tn within the memory 262. Then, the information that the decoding succeeds or fails is transmitted to the selector 263.

The selector 263 includes, for example, a volatile or nonvolatile semiconductor memory therein, and maintains a history table in the semiconductor memory. Then, based on this history table, one of the LLR tables T1 to Tn in the memory 262 is selected, and the LLR table to be used for the data decoding is notified to the decoder 261. FIG. 23 illustrates a structure of the history table.

The history table indicates information relating to the number of times the decoding succeeds in the past using each of the LLR tables T1 to Tn. In FIG. 23, the number of times correction succeeds (the number of times of successful correction) is retained for each of the LLR tables T1 to Tn. As illustrated, in a case where the LLR table T1 is used, the decoding succeeds only N1 times in the past, and in a case where the LLR table T2 is used, the decoding succeeds only N2 times in the past (N1 to Nn are natural numbers). The selector 263 updates the history table based on information that the decoding succeeds, which is received from the decoder 261.

5.2 Operation

Figure 24:
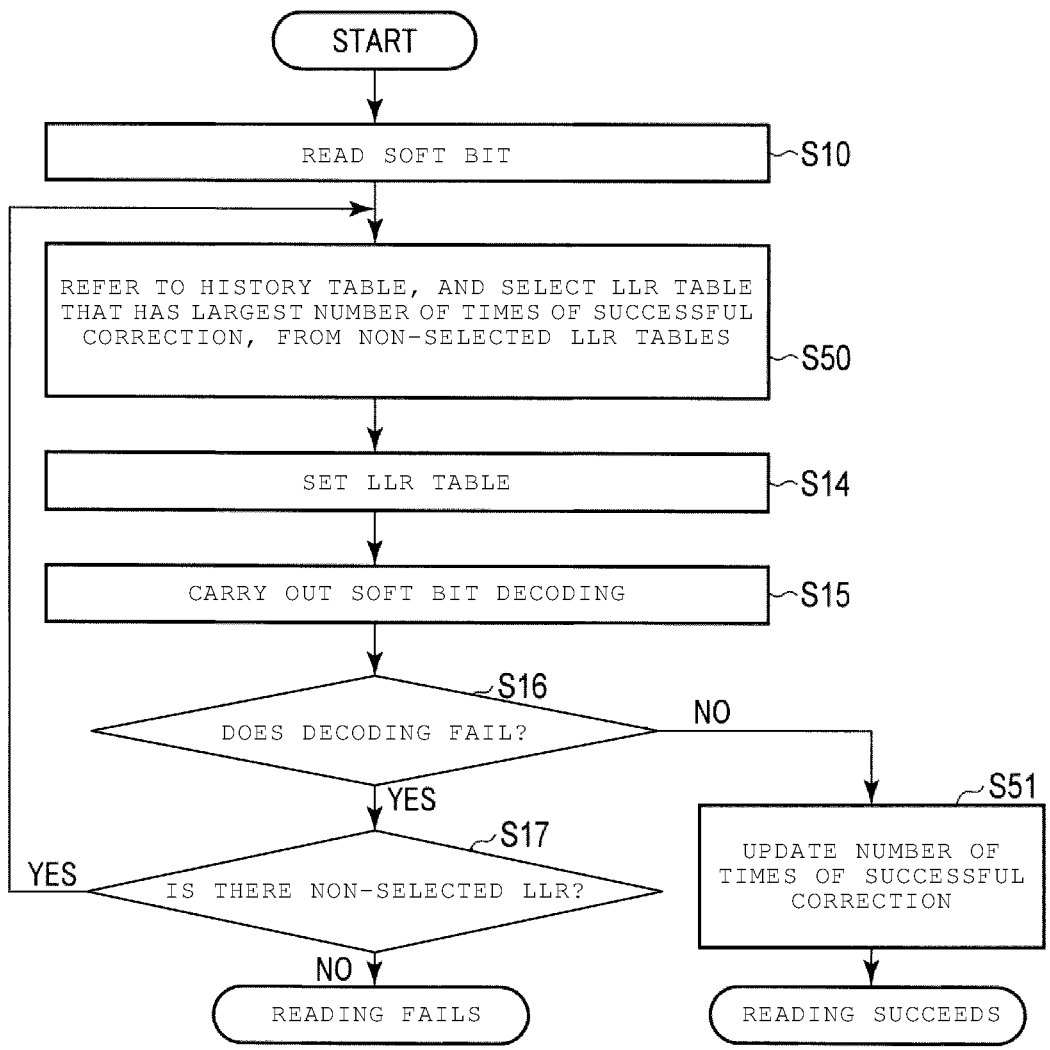
FIG. 24 is a flowchart illustrating soft-decision processing according to the fifth embodiment.

Next, the data read operation in the memory system 1 of the configuration described above is described with a focus particularly on the soft-decision operation in the ECC circuit 260. FIG. 24 is a flowchart of the soft-decision operation.

As illustrated, first, the soft bit reading is performed (Step S10). Step S10 is the same as the first embodiment. Next, the selector 263 of the ECC circuit 260 refers to the history table, and selects an LLR table that has the largest number of times of successful correction, from non-selected LLR tables (Step S50). That is, the selector 263 selects an LLR table that has the largest number of times the data decoding succeeds in the past, in other words, an LLR table that has the greatest likelihood that the decoding will succeed. Then, the selector 263 reads the selected LLR table from the memory 262, and sets the selected LLR table for the decoder 261 (Step S14).

When this step is completed, the decoder 261 decodes (performs the soft bit decoding on) read data received from the NAND flash memory 100, using the LLR table that is set (Step S15). If the decoding succeeds (NO in Step S16), the decoder 261 notifies the selector 263 of the information that the decoding succeeds, and the selector 263 updates the number of times of successful correction in the history table (Step S51). That is, for example, in a case where the LLR table T1 is selected and the data decoding succeeds, the selector 263 adds "+1" to the number N1 corresponding to the LLR table T1 in the history table.

In the case where the decoding fails (YES in Step S16), if there is a non-selected LLR table (YES in Step S17), the process returns to Step S50 and the soft bit decoding is performed using the LLR table that has the next largest number of times of successful correction (Steps S14 to S15). In the case where there is no non-selected LLR table (NO in Step S17), that is, in a case where the decoding did not succeed with any one of the n LLR tables T1 to Tn, the reading is regarded as a failure and the process ends.

5.3 Effect According to the Fifth Embodiment

According to the fifth embodiment, past performance of each LLR table is recorded as the history table, and, based on the recorded past performance, a selection is made in sequential order among the LLR tables that are thought to have the high likelihood of being able to be corrected. Therefore, in the same manner as in the first embodiment, data can be efficiently corrected.

Moreover, in the fifth embodiment, the number of times the correction succeeds is recorded in the history table, but the number of times the correction fails may be recorded instead. In this case, in Step S50 in FIG. 24, the LLR table corresponding to the smallest number of times the correction fails may be selected.

Furthermore, the history table may be created with a default value in advance at the time of factory shipment of the memory system 1, in which case the history table that is set by default is updated whenever the data reading succeeds.

In a case where the default history table is not prepared, the order in which one of the LLR tables is selected may be retained. That is, when the NAND flash memory 100 is used for the first time, the history table has not been created, or the history table itself is not present. Furthermore, soon after the NAND flash memory 100 starts to be used, there is a likelihood that an amount of information recorded in the history table is small and does not have sufficient reliability. In such a case, the LLR table may be selected according to the order that is prescribed in advance, and, when the number of times of reading exceeds a fixed number, the history table may start to be used. Alternatively, the LLR table may be selected according to the methods that are described in the first and fourth embodiments, until the number of times of reading exceeds a fixed number.

Moreover, the processor 230 may write the history table to a specific region (a ROM fuse region or the like) of the NAND flash memory 100, along with the LLR table or information, such as the number of times W/E or the number of times of reading, in such a manner that the history table is not lost when the memory system 1 is powered off. Thereafter, when the memory system 1 is powered on, the history table read from the NAND flash memory 100 may be set for the selector 263.

6. Sixth Embodiment

Next, a memory system according to a sixth embodiment is described. In the sixth embodiment, the history table used in the fifth embodiment is used for each physical address, and thus the sixth embodiment is equivalent to a combination of the fourth embodiment and the fifth embodiment. Only a difference from the fifth embodiment will be described below.

6.1 History Table

As described above, in the configuration in FIG. 22, which is described in the fifth embodiment, the selector 263 according to the present embodiment includes a plurality of history tables. The plurality of history tables is referred to as a history table group.

FIG. 25 illustrates a structure of the history table group. As illustrated, the history table group includes the plurality of history tables that are correlated with blocks BLK0 to BLKm (m is a natural number, and (m+1) is the number of blocks within the memory cell array 110), respectively.

That is, the history table that is correlated with block BLK0 retains the number of times the data decoding succeeds while reading data from the block BLK0, for each LLR table, the history table that is associated with the block BLK1 retains the number of times the data decoding succeeds while reading data from the block BLK1, for each LLR table, and so forth.

Of course, as described in the fourth embodiment, the history table prepared for each block BLK is only an example, and a plurality of history tables may be provided according to the physical address. For example, as described in the second example of the fourth embodiment, a plurality of word lines WL may be categorized into a plurality of zones (for example, eight word lines are divided into three zones, and so forth), and the history table may be prepared for each zone.

6.2 Operation

Figure 26:
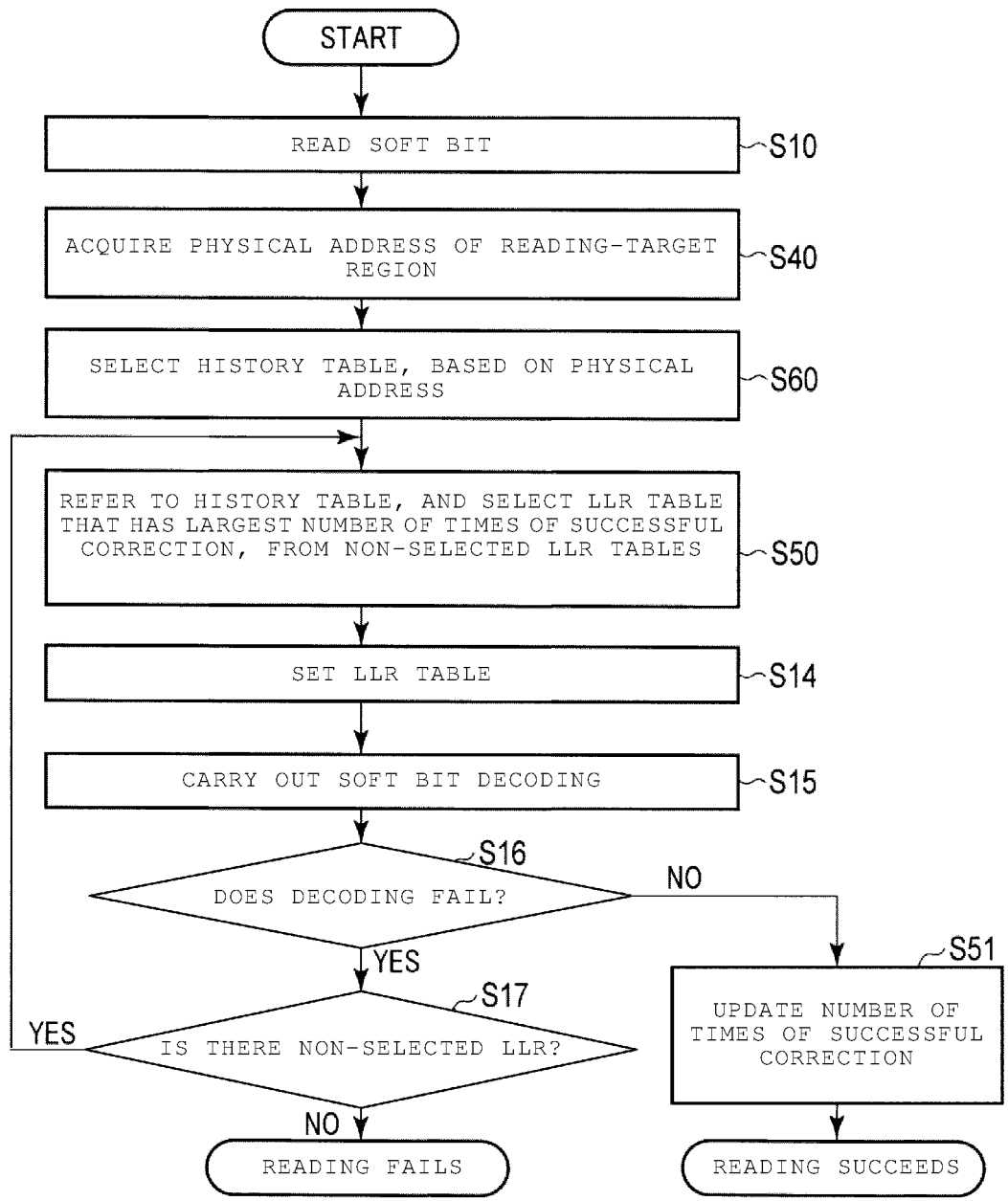
FIG. 26 is a flowchart illustrating soft-decision processing according to the sixth embodiment.

Next, the data read operation in the memory system 1 of the configuration described above is described with a focus particularly on the soft-decision operation in the ECC circuit 260. FIG. 26 is a flowchart of the soft-decision operation.

As illustrated, a difference of the present embodiment from the fifth embodiment illustrated in FIG. 24 is described below.

That is, after Step S10, the selector 263 acquires the physical address of the reading-target region (Step S40). This step is the same as the one described in the fourth embodiment.

Subsequently to Step S40, the selector 263 selects the corresponding history table from the history table group illustrated in FIG. 25, according to the physical address that is received in Step S40 (Step S60). Thereafter, based on the history table that is selected in Step S60, the processing operations in Step S50 and later are performed in a manner similar to the ones described in the fifth embodiment.

6.3 Effect According to the Sixth Embodiment

As described in the fourth embodiment, the property of the memory cell can differ depending on a physical position thereof. For that reason, an optimal LLR table may differ depending on the physical position. According to the present embodiment, the LLR table suitable for each region can be selected by preparing the history table for each region (for example, every block BLK) within the memory cell array.

Moreover, in a case where the LLR table is prepared on a per-block basis, there is no need to establish a one-to-one correspondence between the block and the LLR table. For example, the LLR may be prepared for each of the plurality of blocks, and may be prepared for only a block that is expected to have a low property when compared with others.

Alternatively, the tables may be prepared only for blocks that have been accessed most recently. Specifically, the LLR tables may be prepared only for blocks that were set to be a reading target within the most recent reading access of 50 times. Then, the LLR tables for blocks that were not set to be the reading target within the most recent reading access of 50 times may be discarded.

Also, the history table according to the present embodiment may also be written to the NAND flash memory 100 when the memory system is powered off.

7. Seventh Embodiment

Next, a memory system according to a seventh embodiment is described. In the seventh embodiment, the history table used in the fifth embodiment is prepared for each range of number of times W/E, and therefore the seventh embodiment is equivalent to a combination of the first embodiment and the fifth embodiment. Only a difference with the fifth embodiment will be described below.

7.1 History Table

The selector 263 according to the present embodiment retains the history table group in the same manner as the selector 263 according to the sixth embodiment. FIG. 27 illustrates a structure of a history table group according to the present embodiment. As illustrated, the history table group includes a plurality of history tables (k history tables and k is a natural number that is equal to or larger than 2) that are correlated with a range of the numbers of times W/E, respectively, and corresponds to the cases of first to k-th ranges within which the number of times W/E falls. An example of each of the ranges is described below.

First range: the number of times W/E is equal to or larger than 0, but is smaller than 100

Second range: the number of times W/E is equal to or larger than 100, but is smaller than 200

Third range: the number of times W/E is equal to or larger than 200, but is smaller than 300 k-th range: the number of times W/E is equal to or larger than 1000

That is, in a case where the number of times of access for reading to a certain block falls within the first range, an LLR table that has the largest number of times of successful correction is selected from the history tables that correspond to the first range.

7.2 Operation

Figure 28:
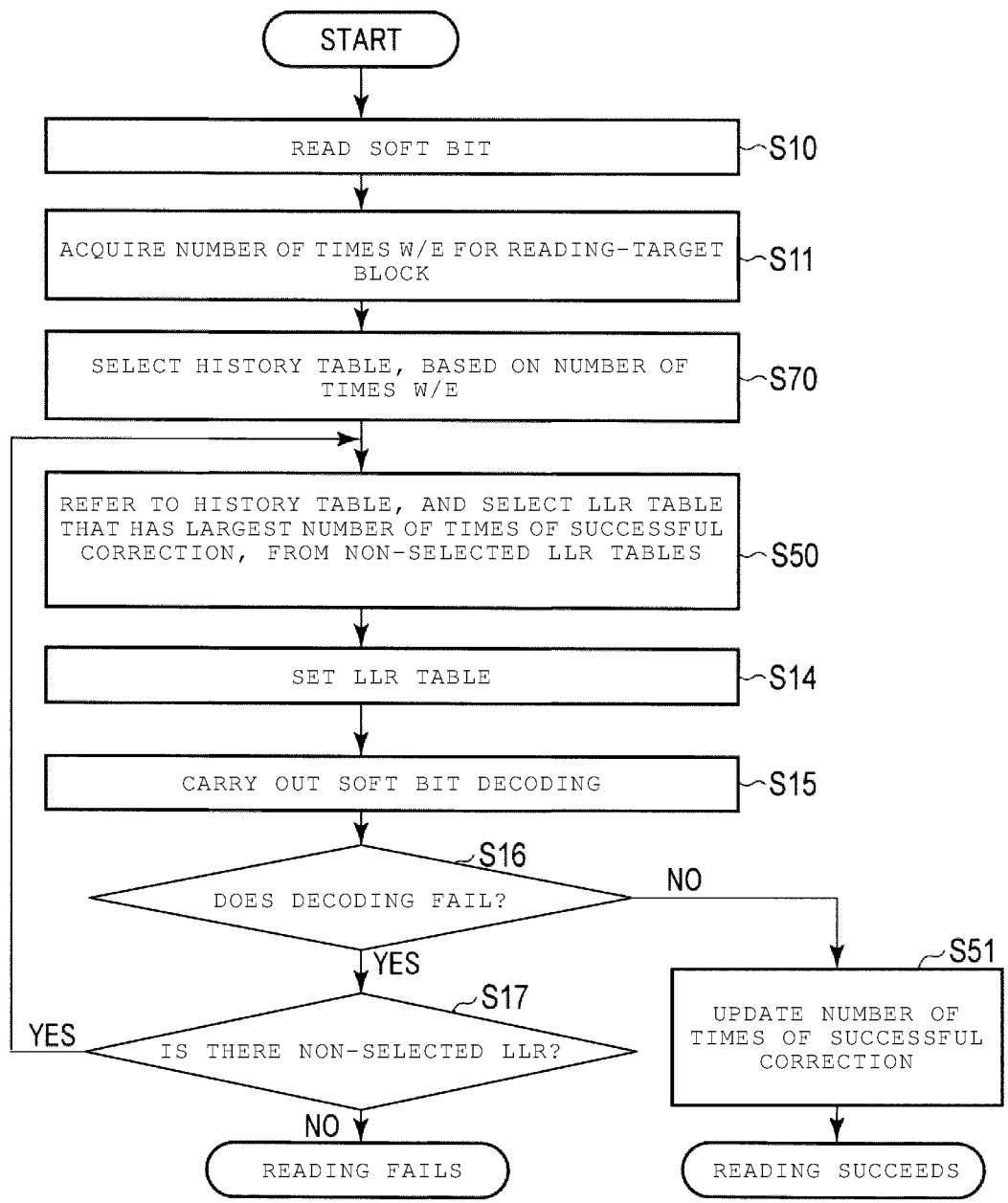
FIG. 28 is a flowchart illustrating soft-decision processing according to the seventh embodiment.

Next, the data read operation in the memory system 1 of the configuration described above is described with a focus particularly on the soft-decision operation in the ECC circuit 260. FIG. 28 is a flowchart of the soft-decision operation.

As illustrated, a difference of the present embodiment from the fifth embodiment illustrated in FIG. 24 is described below.

That is, after Step S10, the selector 263 acquires the number of times W/E for the reading-target region (Step S11). This processing is the same as the one described in the first embodiment.

Subsequently to Step S11, the selector 263 selects the corresponding history table from the history table group illustrated in FIG. 27, according to the number of times W/E that is received in Step S11 (Step S70). Thereafter, based on the history table that is selected in Step S70, the processing operations in Step S50 and later are performed in a similar manner as the ones described in the fifth embodiment.

7.3 Effect According to the Present Embodiment

As described in the first embodiment, the property of the memory cell can differ depending on the number of times W/E. For that reason, an optimal LLR table may differ depending on the number of times W/E. According to the present embodiment, a suitable LLR table can be selected by preparing the history table for each range of the number of times W/E.

Moreover, in the present embodiment, the history table is prepared in association with the number of times W/E. However, the history table may be prepared in association with the number of times of reading as in the second embodiment, and the history table may be prepared in association with both the number of times W/E and the number of times of reading as in the third embodiment. In a case where the history table is associated with both the number of times W/E and the number of times of reading, the number of times of reading may increase by +1 each time the operation is performed two times, whereas the number of times W/E is increased by +1 each time the operation is performed one time. The reason for this is because an influence on the memory cell is considered to be larger in the writing and erasing operations than in the read operation.

Also, the history table group according to the present embodiment may also be written to the NAND flash memory 100 when the memory system is powered off.

8. Modification Example and the Like

As described above, in the memory system according to the present embodiment, a plurality of LLR tables is prepared and the order in which one of the LLR tables is selected for the soft-decision decoding is dynamically changed according to the number of times W/E, the number of times of reading, the physical address, and/or the number of times of successful correction. As a result, under various conditions for reading, a more suitable LLR table can be selected, and an error correction speed can be improved.

Moreover, no limitation to the embodiments described above is imposed and various modifications to the embodiments are possible. For example, the threshold distribution moves to the low voltage side as passage of time. That is, as opposed to the change in distribution, which is described with reference to FIG. 5, the lower edge of the threshold distribution widens to the low voltage side. The LLR tables may be prepared in consideration of this influence.

That is, the LLR tables in consideration of the writing and erasing operations are prepared in the first embodiment, and the LLR tables inconsideration of the read operation are prepared in the second embodiment. Instead, a plurality of LLR tables that may be prepared in consideration of the passage of time since data were written to the memory. In this case, for example, the controller 200 includes a timer circuit and records time when data were written for each block or every page. Then, the LLR table may be selected according to the passage of time from the time when the writing was performed. Of course, the LLR table in consideration of the passage of time may be used in the first to seventh embodiments described above, and a plurality of history tables may be prepared according to the passage of time. In a case where such LLR tables are used in the fifth embodiment, for example, a plurality of history tables may be prepared for each range of passed time periods, and an optimal history table may be selected according to the passage of time in an access-target region.

Furthermore, in the fourth and seventh embodiments, the LLR table may be prepared for each access region in accordance with the number of times of writing, erasing, and/or reading. That is, the LLR table or the history table may be prepared and selected according to at least one of the numbers of times of writing, erasing, and reading and the position of the access region.

Additionally, in the fifth to seventh embodiments, for example, the ECC circuit 260 may further include a counter and the counter may count the number of times the decoding succeeds. Then, this result of the counting is stored in the selector.

Moreover, the LLR tables used in the third embodiment are created in consideration of the threshold change due to the write operation, the erasing operation, and the read operation. However these operations do not necessarily need to be considered, and it is sufficient that different LLR tables are prepared as described in the fifth embodiment. Then, a selection may be made according to the number of times W/E or the number of times of reading. This is also the same for the first and second embodiments.

In the above embodiments, the NAND flash memory is described as an example of the semiconductor memory device. However, the semiconductor memory device is not limited to the NAND flash memory, and the embodiments described above can apply to all storage devices in which the soft-decision processing is carried out.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile semiconductor memory; and
a controller configured to
maintain a plurality of log likelihood ratio (LLR) tables for correcting data read from the nonvolatile semiconductor memory,
count a number of times at least one of write operations, erase operations, and read operations having been carried out with respect to each unit storage region of the nonvolatile semiconductor memory,
determine an order in which the LLR tables are referred to, on the basis of the counted number corresponding to a target unit storage region of a read operation, and
carry out correcting of data read from the target unit storage region of the read operation, using one of the LLR tables selected according to the determined order.

2. The memory system according to claim 1, wherein the plurality of LLR tables includes
a first plurality of LLR tables that are each different depending on the number of times of the write operations and the number of times of the erase operations, and
a second plurality of LLR tables that are each different depending on the number of times of the read operations.

3. The memory system according to claim 1, wherein the unit storage region is a unit of erasing data from the nonvolatile semiconductor memory.

4. The memory system according to claim 3, wherein the unit of erasing data is a block of memory cells arranged in rows and columns.

5. The memory system according to claim 3, wherein the unit of erasing data is a page of memory cells arranged in a single row across multiple columns.

6. The memory system according to claim 1, wherein the controller carries out the correcting using a next LLR table in the determined order, when the correcting using the selected LLR table fails.

7. The memory system according to claim 1, wherein the data read from the target unit storage region include a plurality of values that are sensed using different read voltages.

8. The memory system according to claim 1, wherein the controller, prior to carrying out correcting of data read from the target unit storage region of the read operation using the selected LLR table, performs a hard bit reading using a preset read voltage and a hard bit decoding processing on data read using the hard bit reading.

9. The memory system according to claim 8, wherein the controller performs a soft bit reading using a plurality of read voltages after determining that the hard bit reading fails.

10. The memory system according to claim 9, wherein the data read using the soft bit reading are corrected by the controller using the selected LLR table.

11. The memory system according to claim 1, wherein the controller maintains a number of times of successful correction of data read by the read operation, using each LLR table.

12. The memory system according to claim 11, wherein the controller determines the order in which the LLR tables are referred to, further on the basis of the number of times of successful correction of data.

* * * * *